US010646893B2

(12) United States Patent
Burzo et al.

(10) Patent No.: US 10,646,893 B2
(45) Date of Patent: May 12, 2020

(54) AUTOMATIC PIEZO STROKE ADJUSTMENT

(71) Applicant: NORDSON CORPORATION, Westlake, OH (US)

(72) Inventors: Christopher Burzo, Escondido, CA (US); Michael Gorman, Oceanside, CA (US); Alan R. Lewis, Carlsbad, CA (US); Cutler Crowell, III, San Marcos, CA (US)

(73) Assignee: Nordson Corporation, Westlake, OH (US)

( * ) Notice: Subject to any disclaimer, the term of this patent is extended or adjusted under 35 U.S.C. 154(b) by 256 days.

(21) Appl. No.: 15/747,765

(22) PCT Filed: Aug. 31, 2016

(86) PCT No.: PCT/US2016/049681
§ 371 (c)(1),
(2) Date: Jan. 26, 2018

(87) PCT Pub. No.: WO2017/040648
PCT Pub. Date: Mar. 9, 2017

(65) Prior Publication Data
US 2018/0221910 A1 Aug. 9, 2018

Related U.S. Application Data

(60) Provisional application No. 62/211,961, filed on Aug. 31, 2015.

(51) Int. Cl.
*B05C 5/02* (2006.01)
*B05C 11/10* (2006.01)
(Continued)

(52) U.S. Cl.
CPC ............ *B05C 5/0225* (2013.01); *B05C 5/022* (2013.01); *B05C 11/1034* (2013.01);
(Continued)

(58) Field of Classification Search
CPC ............... B41J 2/04508; B41J 2/04513; B41J 2/04515; B41J 2/0452; B41J 2/04536;
(Continued)

(56) References Cited

U.S. PATENT DOCUMENTS 8,948,898 B2    2/2015  Barkmann et al.
2007/0069041 A1 3/2007  Quinones et al.
(Continued)

FOREIGN PATENT DOCUMENTS

CN    101288357 A    10/2008
CN    101422763 A    5/2009
(Continued)

OTHER PUBLICATIONS

International Patent Application No. PCT/US2016/049681; Int'l Preliminary Report on Patentability; dated Mar. 15, 2018; 7 pages.
(Continued)

*Primary Examiner* — Juanita D Jackson
(74) *Attorney, Agent, or Firm* — Baker & Hostetler LLP

(57) ABSTRACT

A method of calibrating the jetting profile includes applying voltage to a piezoelectric actuator to move a valve closure structure between non-impact and impact positions, sensing the position of the valve closure structure, establishing a reference point using voltage and position data, and using the reference point to adjust the voltage applied. Another method uses a mechanical stop to calibrate a jetting system. This method includes applying voltage to the piezoelectric actuator to move the valve closure structure between non-impact and impact calibration positions, sensing the position of the valve closure structure, generating voltage and posi-
(Continued)

tion calibration data, establishing a master reference point using this data, and using the master reference point to determine wear of at least one of: the piezoelectric actuator and the valve closure structure. Another method of operating a jetting system includes the user inputting information into a control component. Another method involves using voltage data and the position data relating to a piezoelectric actuator for preventative maintenance of one or more components of the jetting valve.

33 Claims, 14 Drawing Sheets

(51) Int. Cl.
    *H05K 13/08*      (2006.01)
    *H05K 13/04*      (2006.01)
    *B05B 1/30*      (2006.01)

(52) U.S. Cl.
    CPC ......... *H05K 13/0469* (2013.01); *H05K 13/08* (2013.01); *B05B 1/3046* (2013.01); *B05C 5/0291* (2013.01)

(58) Field of Classification Search
    CPC .. B51B 1/3046; B05C 5/0291; H05K 13/046; H05K 13/08
    See application file for complete search history.

(56) References Cited

U.S. PATENT DOCUMENTS

| | | |
|---|---|---|
| 2009/0107398 A1 | 4/2009 | Hassler, Jr. et al. |
| 2012/0285990 A1 | 11/2012 | Abernathy et al. |
| 2013/0048759 A1* | 2/2013 | Aguilar et al. ............... 239/562 |
| 2014/0150518 A1 | 6/2014 | Bloom et al. |
| 2016/0354791 A1* | 8/2016 | des Jardins et al. ...... B05B 1/24 |

FOREIGN PATENT DOCUMENTS

| | | |
|---|---|---|
| EP | 1308216 A2 | 5/2003 |
| EP | 2 561 932 A2 | 2/2013 |
| WO | 2008/151804 A1 | 12/2008 |
| WO | 2017202985 A1 | 11/2017 |

OTHER PUBLICATIONS

CN Office Action dated Jan. 28, 2019 for CN Application No. 201680049698.

* cited by examiner

400

402 APPLY VOLTAGE TO THE PIEZOELECTRIC ACTUATOR TO MOVE THE VALVE CLOSURE STRUCTURE BETWEEN NON-IMPACT AND IMPACT POSITIONS

404 SENSE THE POSITION OF THE VALVE CLOSURE STRUCTURE AT EACH RESPECTIVE VOLTAGE USING THE SENSING DEVICE

406 GENERATE VOLTAGE AND POSITION DATA

408 ANALYZE THE VOLTAGE AND POSITION DATA TO DETERMINE THE REFERENCE POINT (RP)

410 DETERMINE THE CLOSED VOLTAGE (VC) BASED ON THE REFERENCE POINT (RP)

411 DETERMINE THE SEALED VOLTAGE (VS) BASED ON THE CLOSED VOLTAGE (VC)

412 USE THE SEALED VOLTAGE (VS) TO SHIFT THE JETTING PROFILE TO A CALIBRATED JETTING PROFILE

FIG. 4

AUTOMATIC PIEZO STROKE ADJUSTMENT

CROSS REFERENCE TO RELATED APPLICATIONS

This application is a U.S. National Stage of International Patent App. No. PCT/US2016/049681, filed Aug. 31, 2016, and published as International Patent Pub. No. WO 2017/040648 A1 on Mar. 9, 2017, which claims priority to U.S. Provisional Patent Application No. 62/211,961, filed Aug. 31, 2015, both of which are incorporated herein by reference in their entirety.

TECHNICAL FIELD

The present invention generally relates to non-contact, jetting dispensers for depositing small droplets of a viscous fluid onto a substrate, and more specifically, to dispensers of this type that are actuated by one or more piezoelectric elements.

BACKGROUND

Non-contact viscous material dispensers are often used to apply minute amounts of viscous materials, i.e. those with a viscosity exceeding fifty centipoise, onto substrates. As used herein, "non-contact" means where the jetting dispenser does not contact the substrate during the dispensing process. For example, non-contact jetting dispensers are used to apply various viscous materials onto electronic substrates like printed circuit boards. Viscous materials applied to electronic substrates include, by way of example and not by limitation, general purpose adhesives, solder paste, solder flux, solder mask, thermal grease, lid sealant, oil, encapsulants, potting compounds, epoxies, die attach fluids, silicones, RTV, and cyanoacrylates.

Specific applications abound for dispensing viscous materials from a non-contact dispenser onto a substrate. In semiconductor package assembly, applications exist for underfilling, solder ball reinforcement in ball grid arrays, dam and fill operations, chip encapsulation, underfilling chip scale packages, cavity fill dispensing, die attach dispensing, lid seal dispensing, no flow underfilling, flux jetting, and dispensing thermal compounds, among other uses. For surface-mount technology (SMT) printed circuit board (PCB) production, surface mount adhesives, solder paste, conductive adhesives, and solder mask materials may be dispensed from non-contact dispensers, as well as selective flux jetting.

Jetting dispensers generally contain either pneumatic or electric actuators for moving a shaft or tappet repeatedly toward a seat while jetting a droplet of viscous material from an outlet orifice of the dispenser. The electrically actuated jetting dispensers can, more specifically, use a piezoelectric actuator. Precisely jetting fluids using a valve closure structure contacting a valve seat requires that the shaft be brought into contact with the valve seat using a prescribed stroke (displacement) and velocity to effectively eject a dot of fluid material from the outlet of the nozzle. The displacement and velocity curve collectively form the motion profile. The stroke, velocity, and sealing force are best controlled when the point of impact between the valve closure structure and the valve seat is precisely known and measured. There must be sufficient force after the impact of the shaft with the valve seat to create a seal to prevent leakage of the fluid material. However, too much force will result in excess wear, or even damage, to the components.

Changes of only a few micrometers affect the performance of the fluid dispenser. Typically, these adjustments are performed manually by a user through mechanical means, such as adjusting a screw. This manual process takes multiple iterations yet still fails to precisely adjust the motion profile for the desired performance. Therefore, there exists a continuing need to determine the position of the valve closure structure relative to the valve seat to optimize performance and settings of the fluid dispenser, and adjust the motion profile of the fluid dispenser accordingly.

For at least these reasons, it would be desirable to provide a jetting system and method that addresses these and other issues.

SUMMARY

In one embodiment, a method of calibrating the jetting profile of a jetted fluid material for a jetting system is disclosed. The jetting system includes a jetting dispenser and a control component operatively coupled to the jetting dispenser. The jetting dispenser includes a valve seat, a valve closure structure, and a piezoelectric actuator. The method includes applying voltage to the piezoelectric actuator to move the valve closure structure between a non-impact position where the valve closure structure is not impacting the valve seat and an impact position where at least a portion of the valve closure structure is impacting the valve seat. The method also includes generating voltage data as the valve closure structure is moved. The method also includes sensing the position of the valve closure structure as the valve closure structure is moved using a sensing device. The method also includes generating position data as the valve closure structure is moved. The method also includes establishing a reference point using the voltage and position data. The method also includes using the reference point to adjust the voltage applied to the piezoelectric actuator.

In another embodiment, a method of calibrating the jetting profile of a jetted fluid material for a jetting system is disclosed. The jetting system includes a jetting dispenser and a control component operatively coupled to the jetting dispenser. The jetting dispenser includes a piezoelectric actuator, a valve seat, a valve closure structure, and a mechanical stop positioned at a predetermined distance away from the valve closure structure in a non-impact calibration position. The method includes applying voltage to the piezoelectric actuator to move the valve closure structure between the non-impact calibration position where the valve closure structure is not impacting the mechanical stop and an impact calibration position where at least a portion of the valve closure structure is impacting the mechanical stop. The method also includes generating voltage calibration data as the valve closure structure is moved. The method also includes sensing the position of the valve closure structure as the valve closure structure is moved using a sensing device. The method also includes generating position calibration data as the valve closure structure is moved. The method also includes establishing a master reference point using the voltage and position calibration data. The method also includes using the master reference point to determine wear of at least one of: the piezoelectric actuator, the valve closure structure, and the valve seat.

In yet another embodiment, a method of calibrating the jetting profile of a jetted fluid material for a jetting system is disclosed. The jetting system includes a jetting dispenser and a control component operatively coupled to the jetting dispenser. The jetting dispenser includes a valve seat, a valve closure structure, a piezoelectric actuator, and a mechanical stop positioned at a predetermined distance away from the valve closure structure in a non-impact calibration position. The method includes applying voltage to the piezoelectric actuator to move the valve closure structure between a non-impact position where the valve closure structure is not impacting the valve seat and an impact position where at least a portion of the valve closure structure is impacting the valve seat. The method also includes generating voltage data as the valve closure structure is moved. The method also includes sensing the position of the valve closure structure as the valve closure structure is moved using a sensing device. The method also includes generating position data as the valve closure structure is moved. The method also includes establishing a reference point using the voltage and position data. The method also includes applying voltage to the piezoelectric actuator to move the valve closure structure between the non-impact calibration position where the valve closure structure is not impacting the mechanical stop and an impact calibration position where at least a portion of the valve closure structure is impacting the mechanical stop. The method also includes generating voltage calibration data as the valve closure structure is moved. The method also includes sensing the position of the valve closure structure as the valve closure structure is moved using the sensing device. The method also includes generating position calibration data as the valve closure structure is moved. The method also includes establishing a master reference point using the voltage and position calibration data. The method also includes comparing the reference point to the master reference point to determine wear of the valve seat.

In yet another embodiment, a method of operating a jetting system by a user is disclosed. The jetting system includes a jetting dispenser and a control component operatively coupled to the jetting dispenser. The jetting dispenser includes a piezoelectric actuator, a valve seat, a valve closure structure, and a mechanical stop positioned at a predetermined distance away from the valve closure structure in a non-impact calibration position. The method includes inputting the fluid type into the control component by the user. The method also includes inputting the jetting frequency into the control component by the user. The method also includes inputting the droplet size into the control component by the user. The method also includes determining a master calibration profile by applying voltage to the piezoelectric actuator to move the valve closure structure between the non-impact calibration position where the valve closure structure is not impacting the mechanical stop and an impact calibration position where at least a portion of the valve closure structure is impacting the mechanical stop. The method also includes applying the master calibration profile to the jetting system using the control component. The method also includes determining a calibrated jetting profile by applying voltage to the piezoelectric actuator to move the valve closure structure between a non-impact calibration position where the valve closure structure is not impacting the valve seat and an impact calibration position where at least a portion of the valve closure structure is impacting the valve seat. The method also includes applying the calibrated jetting profile to the jetting system.

In yet another embodiment, a method of doing maintenance in a jetting system is disclosed. The jetting system includes a jetting dispenser and a control component operatively coupled to the jetting dispenser. The jetting dispenser includes a piezoelectric actuator and a valve closure structure. The method includes applying voltage to the piezoelectric actuator to move the valve closure structure between a first position and a second position. Voltage data is generated as the valve closure structure is moved. The position of the valve closure structure is sensed using a sensing device as the valve closure structure is moved. Position data is generated as the valve closure structure is moved. The voltage data and the position data are used for preventative maintenance.

In yet another embodiment, a method of calibrating the jetting profile of a jetting fluid material for a jetting system is disclosed. The jetting system includes a jetting dispenser and a control component operatively coupled to the jetting dispenser. The jetting dispenser includes a valve seat, a valve closure structure, and a piezoelectric actuation mechanism having a piezoelectric actuator. The method includes receiving input from a user of a desired stroke length of the valve closure structure. Voltage is applied to the piezoelectric actuator to move the valve closure structure between a non-impact position where the valve closure structure is not impacting the valve seat and an impact position where at least a portion of the valve closure structure is impacting the valve seat. Voltage data is generated as the valve closure structure is moved. The position of the valve closure structure is sensed using a sensing device as the valve closure structure is moved. Position data is generated as the valve closure structure is moved. Based, at least in part, on the voltage data and the position data, a reference point is determined. The method further includes, based, at least in part, on the voltage data and the position data, determining a top voltage corresponding to the position of the valve closure structure resulting in the desired stroke length of the valve closure structure. The reference point and the top voltage are used to adjust a voltage applied to the piezoelectric actuator.

A method of calibrating the jetting profile of a jetted fluid material for a jetting system is disclosed. The jetting system including a jetting dispenser and a control component operatively coupled to the jetting dispenser. The jetting dispenser includes a piezoelectric actuation mechanism having a piezoelectric actuator, a valve closure structure, and a mechanical stop positioned at a predetermined distance away from the valve closure structure in a non-impact calibration position. The method includes applying voltage to the piezoelectric actuator to move the valve closure structure between the non-impact calibration position where the valve closure structure is not impacting the mechanical stop and an impact calibration position where at least a portion of the valve closure structure is impacting the mechanical stop. Voltage calibration data is generated as the valve closure structure is moved. The position of the valve closure structure is sensed using a sensing device as the valve closure structure is moved. Position calibration data is generated as the valve closure structure is moved. The method further includes, based, at least in part, on the voltage calibration data and the position calibration data, determining a reference gain indicative of a ratio of the displacement of the valve close structure to the voltage applied to the piezoelectric actuator. Based, at least in part, on the reference gain, a wear characteristic is determined for at least one of: the piezoelectric actuation mechanism and the valve closure structure.

Various additional features and advantages of the invention will become more apparent to those of ordinary skill in the art upon review of the following detailed description of the illustrative embodiments taken in conjunction with the accompanying drawings.

BRIEF DESCRIPTION OF THE DRAWINGS

FIG. 4 is a flowchart of a method of calibrating a jetting profile according to an embodiment of the invention.

DETAILED DESCRIPTION

Figure 1:
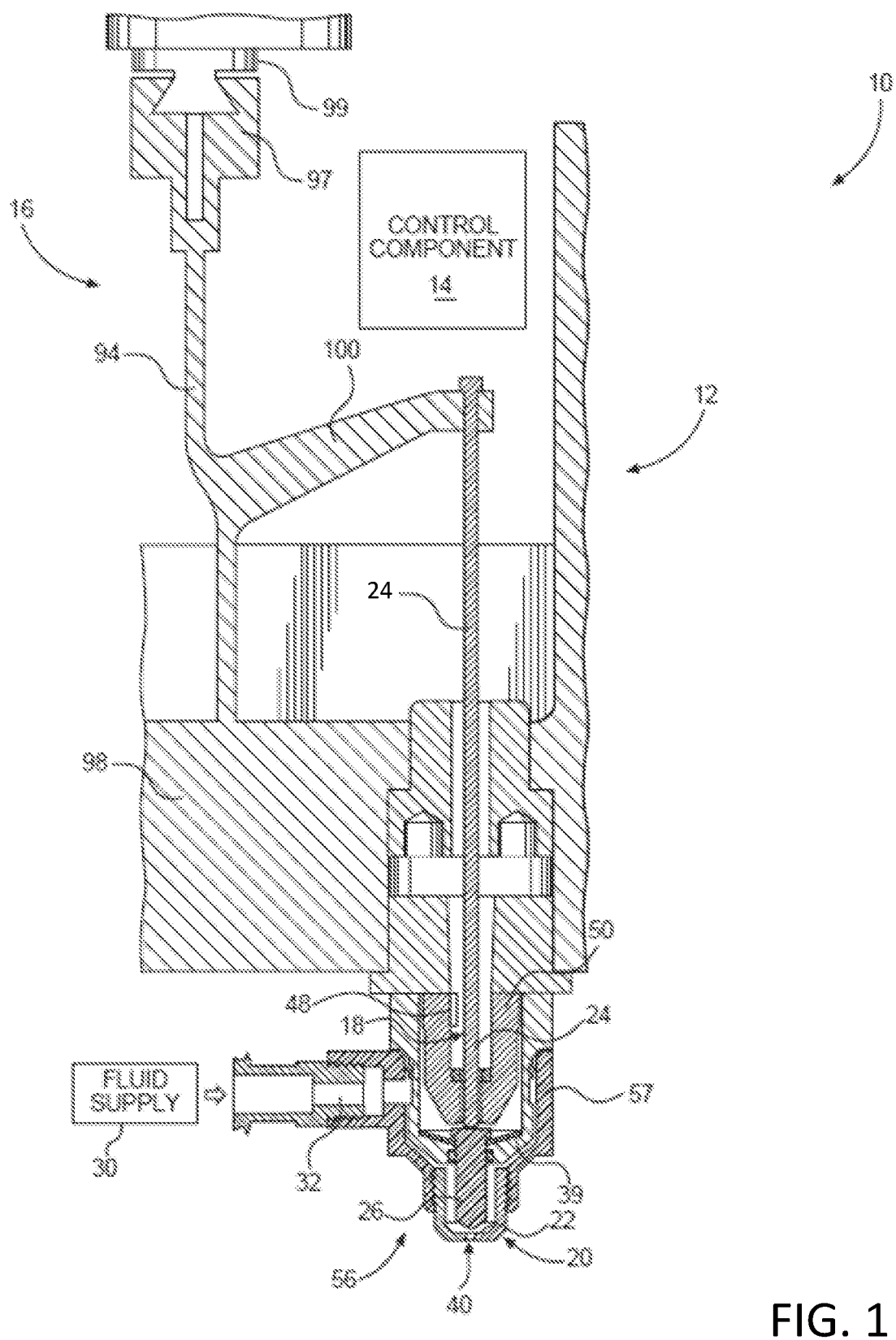
FIGS. 1 and 1A are cross sectional views of a jetting system in an open position and a piezoelectric actuator, respectively, according to an embodiment of the invention.
Figure 1A:
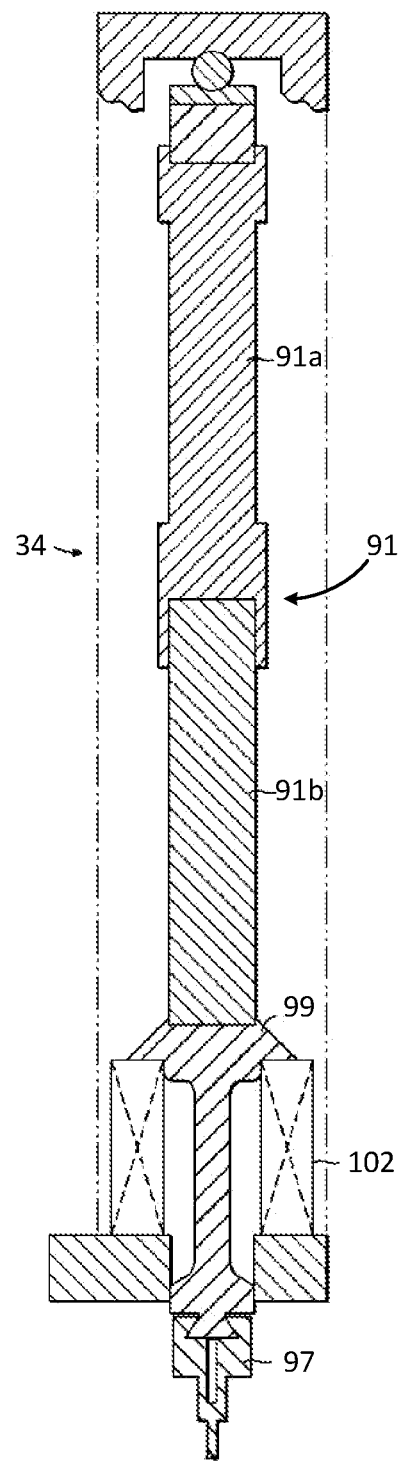
Figure 2:
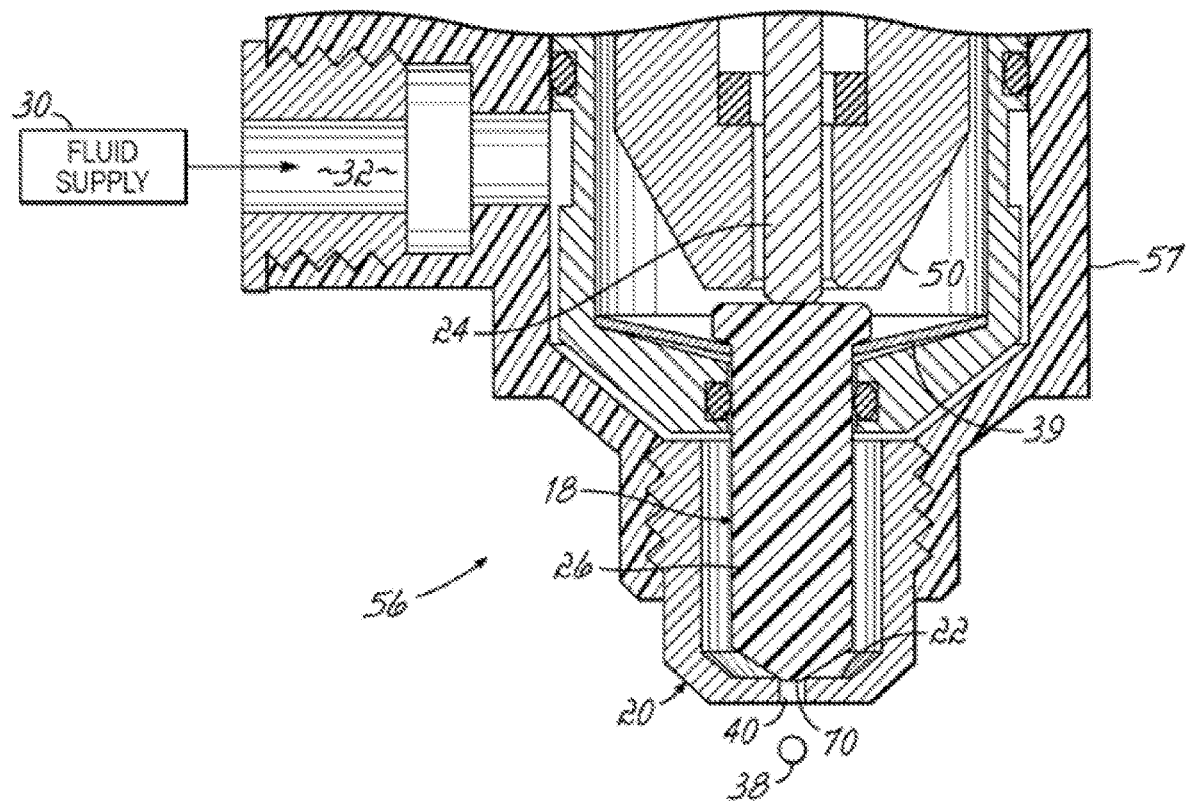
FIG. 2 is an enlarged cross sectional view similar to FIG. 1, but in a closed position.

Referring to FIGS. 1, 1A, and 2, a jetting system 10 in accordance with an embodiment of the invention generally includes a jetting dispenser 12 communicatively coupled with a control component 14. The jetting dispenser 12 includes a piezoelectric actuation mechanism 16, a valve closure structure 18, and a nozzle hub 20 including a valve seat 22. Specifically, the valve closure structure 18 includes a drive pin 24 and a poppet 26. The jetting dispenser 12 receives fluid material 38 under pressure from a suitable fluid supply 30 through a fluid supply conduit 32. The drive pin 24 is driven by action of the piezoelectric actuation mechanism 16 to move a tip 70 of the poppet 26 towards the valve seat 22 and cause a quantity of the fluid material 38 to be dispensed.

The piezoelectric actuation mechanism 16 includes a piezoelectric actuator 34 having piezoelectric stacks 91a, 91b (hereinafter referred to collectively as the piezoelectric stack 91), a plunger 99, and an asymmetrical flexure 94. The flexure 94 is an integral part of an actuator body 98, within which the piezoelectric actuation mechanism 16 is generally disposed, and includes a coupling element 97 that connects the flexure 94 to the plunger 99. A spring 102 within the piezoelectric actuator 34 applies a spring force to the plunger 99 and piezoelectric stack 91 to keep them in compression.

Using the piezoelectric actuator 34, including the piezoelectric stack 91, allows the jetting dispenser 12 to have very specific positional control of the valve closure structure 18 because the voltage applied to the piezoelectric actuator 34 is proportional to the force generated by the piezoelectric actuator 34. Specifically, when a voltage is applied to the piezoelectric stack 91, the piezoelectric actuator 34 expands or lengthens, with the change in length being proportional to the amount of voltage applied. Due to this proportionality, the jetting system 10 is capable of finely controlling the motion profile of the fluid material 38 dispensed through the outlet 40. Pneumatic actuators do not exhibit such proportionality.

The plunger 99 functions as a mechanical interface connecting the piezoelectric stack 91 with the asymmetrical flexure 94. The spring 102 is compressed in the assembly such that the spring force generated by the spring 102 applies a constant load on the piezoelectric stack 91, which preloads the piezoelectric stack 91. The asymmetrical flexure 94, which may be comprised of a metal material, has an arm 100 that is physically secured with an end of the drive pin 24 opposite to the downward tip of the drive pin 24. The asymmetrical flexure 94 functions as a mechanical amplifier that converts the relatively small displacement of the piezoelectric stack 91 into a useful displacement for the drive pin 24 that is significantly larger than the displacement of the piezoelectric stack 91.

The piezoelectric stack 91 of the piezoelectric actuator 34 is a laminate comprised of layers of a piezoelectric ceramic that alternate with layers of a conductor as is conventional in the art. The spring force from the spring 102 maintains the laminated layers of the piezoelectric stack 91 in a steady state of compression. The conductors in the piezoelectric stack 91 are electrically coupled with a driver circuit associated with the control component 14, which supplies current-limited output signals, in a manner well known in the art, with pulse width modulation, frequency modulation, or a combination thereof. When power is periodically supplied from the driver circuit, electric fields are established that change the dimensions of the piezoelectric ceramic layers in the piezoelectric stack 91.

The dimensional changes experienced by the piezoelectric stack 91, which are mechanically amplified by the asymmetrical flexure 94, move the drive pin 24 linearly in a direction parallel to its longitudinal axis. When the piezoelectric ceramic layers of the piezoelectric stack 91 expand, the spring 102 is compressed by the force of the expansion and the asymmetrical flexure 94 pivots about a fixed pivot axis to cause movement of the drive pin 24 upward and away from the poppet 26. This allows a biasing element 39 to move the poppet 26 away from valve seat 22. The drive pin 24 is guided using a drive pin guide 50. When the actuation force is removed and the piezoelectric ceramic layers of the piezoelectric stack 91 are permitted to contract, the spring 102 expands and the asymmetrical flexure 94 pivots to move the drive pin 24 downward into contact with the poppet 26, causing the poppet 26 to contact the valve seat 22 and jet a droplet of material. Thus, in the de-energized state, the piezoelectric actuator 34 maintains the valve in a normally closed position. In operation, the asymmetrical flexure 94 intermittently rocks in opposite directions about a fixed pivot axis as the piezoelectric stack 91 is energized and de-energized to move the drive pin 24 into and out of contact with the poppet 26 to jet droplets of material at a rapid rate.

It will be appreciated that the piezoelectric actuation mechanism 16, and the dispenser 12 in general, may be alternatively configured in some embodiments such that when the piezoelectric stack 91 expands, the drive pin 24 is moved downward and into contact with the poppet 26 to cause a quantity of material to be dispensed from the outlet 40. Conversely, when an applied voltage is removed from the piezoelectric stack 91 to allow the piezoelectric stack 91 to contract, the drive pin 24 is moved upward and away from the poppet 26. Thus, in such an embodiment, the voltage applied to the piezoelectric stack 91 of the piezoelectric actuator 34 corresponds with the downward movement of the drive pin 24 toward the poppet 26.

A sensing device 48 senses the position of the valve closure structure 18 (including a component thereof, such as the drive pin 24 and/or the poppet 26) as it is moved by the piezoelectric actuation mechanism 16. In some aspects, the sensing device 48 may be attached directly or indirectly to the valve closure structure 18. A target (not shown) may be placed on the valve closure structure 18 so that the sensing device 48 reads the position of the target relative to the sensing device 48. For example, FIG. 1 shows the sensing device 48 being a linear encoder that reads position and motion using lines (not shown) placed on the drive pin 24. Thus, the sensing device 48 allows the position and velocity of the valve closure structure 18 to be determined as the valve closure structure 18 is moved. In other embodiments, the sensing device 48 may additionally or alternatively sense the position and velocity of the poppet 26. Further, the position and velocity of the valve closure structure 18 may be measured using a variety of other types of position feedback devices such as eddy current sensors or optical proximity sensors.

FIG. 2 shows a detailed view of the jetting dispenser 12 in a closed position. As shown, the fluid cartridge 56 is attached to the jetting dispenser 12 and includes a cartridge body 57 and a portion of the valve closure structure 18, specifically shown as the poppet 26. While FIGS. 1 and 2 show the jetting dispenser 12 having a fluid cartridge 56, a fluid cartridge 56 is not required and may be replaced by other suitable structure. Further details may be seen in Applicant's co-pending U.S. patent application Ser. No. 14/730,522, filed Jun. 4, 2015, entitled "Jet Cartridges for Jetting Fluid Material, and Related Methods", which is hereby incorporated by reference.

Figure 3:
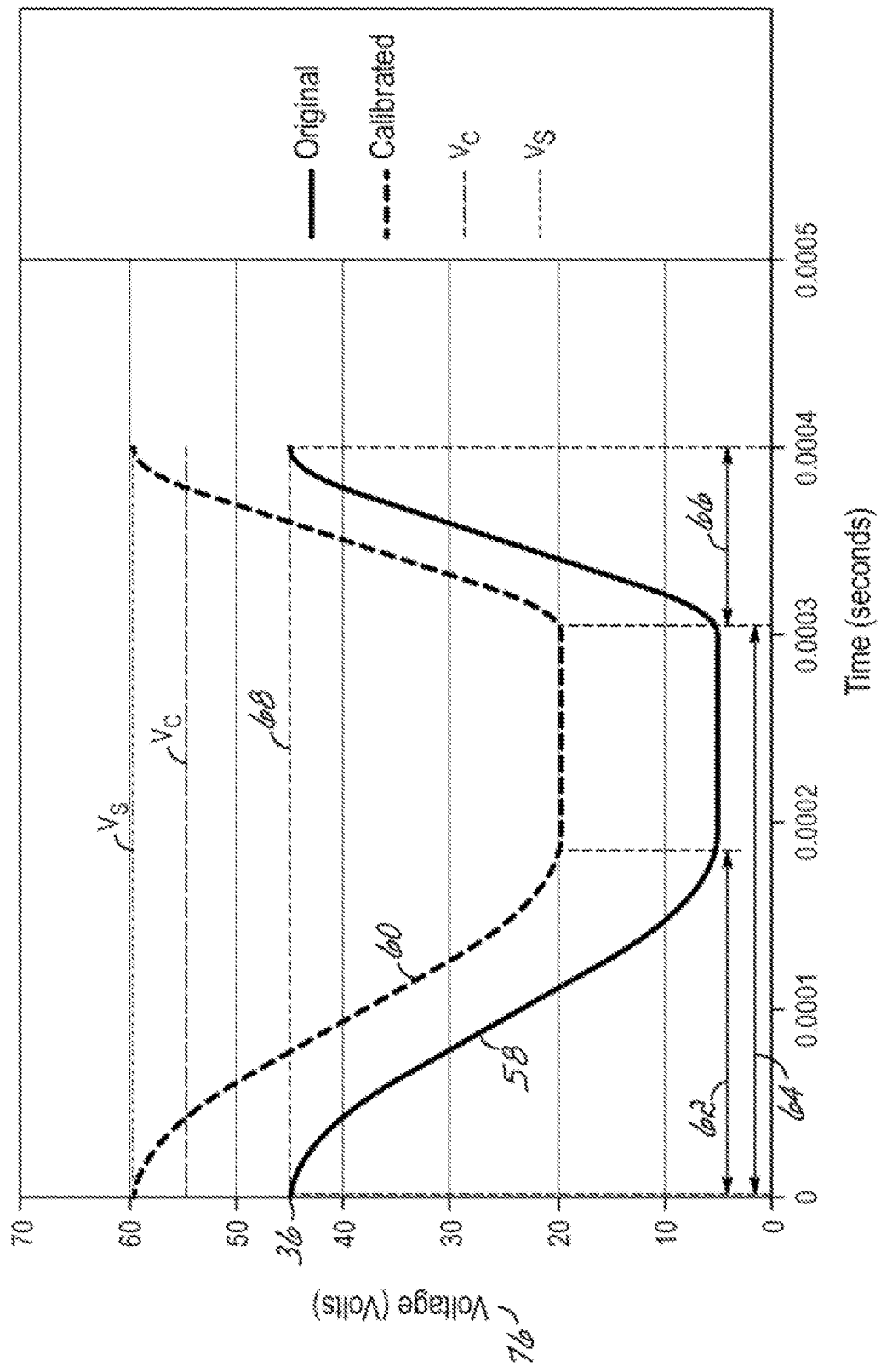
FIG. 3 is a chart comparing an original jetting profile and a calibrated jetting profile.

FIG. 3 depicts a chart of a voltage applied to the piezoelectric actuator 34 (i.e., voltage data 76) and plotted over a period of time making up one dispensing cycle of a dispenser. It will be noted that the chart shown in FIG. 3 contemplates the alternative dispenser 12 configuration described above in which a voltage applied to the piezoelectric actuator 34 (and the consequent expansion thereof) causes the drive pin 24 to move downward and into contact with the poppet 26. Conversely, the removal or reduction of voltage to the piezoelectric actuator 34 (and the consequent contraction thereof) in this alternative configuration causes the drive pin 24 to move upward and away from the poppet 26, allowing the poppet 26 to disengage with the valve seat 22.

Before describing illustrative methods of adjusting the original jetting profile 58 to obtain a calibrated jetting profile 60, it is beneficial to first describe aspects of the original jetting profile 58 and the calibrated jetting profile 60. As used herein, "profile" refers to the range of voltages applied to the piezoelectric actuator 34 over a period of time (e.g., the period of time corresponding to a single complete up-down reciprocation of the valve closure structure 18), which may be repeated multiple times to effectuate a complete dispensing operation. The original jetting profile 58 generally refers to an initial operational profile before one or more of the methods described herein are employed to calibrate the jetting system 10 and/or ascertain a degree of wear of the jetting system 10. The calibrated jetting profile 60 generally refers to an operational profile that is determined after one or more of the aforementioned methods are performed and, preferably, represents an improved operation of the jetting system 10, such as in respect to an optimal sealing engagement of the poppet 26 with the valve seat 22.

The original jetting profile 58 consists of an opening profile 62, an on time 64, and a closing profile 66, and may be created in a variety of different manners. For example, using a graphic user interface (not shown) associated with the control component 14, a user defines the opening profile 62 by selecting a starting voltage 36, an ending voltage 68, the amount of time to go from the starting voltage 36 to the ending voltage 68, and the transition time. The transition time is the amount of time used at the beginning and end of the opening profile 62. The closing profile 66 may be defined in much the same manner. The ending voltage 68 of the closing profile 66 is typically the same as the starting voltage 36 of the opening profile 62. The user may also provide a sealing offset voltage (Vso), which will be discussed in greater detail below. Once the opening profile 62 and closing profile 66 have been created, the opening profile 62 and closing profile 66 are stored in a library of original jetting profiles 58. The opening profile 62 and the closing profile 66 may be stored together in a single file. The user may select the on time 64 after selecting the profile which, as used herein, refers to the time from the beginning of the opening profile 62 to the beginning of closing profile 66. Further, the on time 64 is greater than the time associated with the opening profile 62.

With the original jetting profile 58 discussed above, it is beneficial to provide an illustrative example. With continued reference to FIG. 3, at rest, a maximum jetting profile voltage is applied to the piezoelectric actuator 34 to hold the valve closure structure 18 in the closed position. As shown, the opening profile 62 starts at 45 Volts when in the closed position. The opening profile 62 then drops to 5 Volts in 200 microseconds to move the poppet 26 away from the valve seat 22, with 75 microseconds of transition time at each end. Regarding the closing profile 66, for example, the valve closure structure 18 is separated from the valve seat 22 in the open position at 5 Volts and then increases to 45 Volts in 100 microseconds to move the poppet 26 towards the valve seat 22, with 25 microseconds of transition time at each end.

With the original jetting profile 58 discussed above, relevant voltage measurements are now discussed with continued reference to FIG. 3. Various illustrative methods may be used to determine a closed voltage (Vc) in the calibrated jetting profile 60 based on the original jetting profile 58. The closed voltage (Vc) is the voltage at which the tip 70 of the valve closure structure 18 first impacts the valve seat 22, preferably with a desired force and velocity. The sealing offset voltage (Vso) is the additional voltage applied to the closed voltage (Vc) to achieve a sealed voltage (Vs) at which there is sufficient force applied to the tip 70 of the valve closure structure 18 to close without leakage. The sealing offset voltage (Vso) is dependent at least upon the type of fluid material 38 being dispensed and the pressure of the fluid material 38, and generally ranges from about 5 Volts to 30 Volts. As mentioned above, the sealing offset voltage (Vso) is typically a known constant throughout the methods described herein, and may be initially input into the control component 14 by the user. The closed voltage (Vc), the sealing offset voltage (Vso), and the sealed voltage (Vs) are related using the formula Vs=Vc+Vso. It will be noted that the sealing offset voltage (Vso) may be a negative value in some embodiments, such as with the configuration of the dispenser 12 depicted in FIGS. 1 and 1A in which the downward movement of the drive pin 24 and poppet 26 corresponds to a reduction in voltage applied to the piezoelectric actuator 34.

Figure 5:
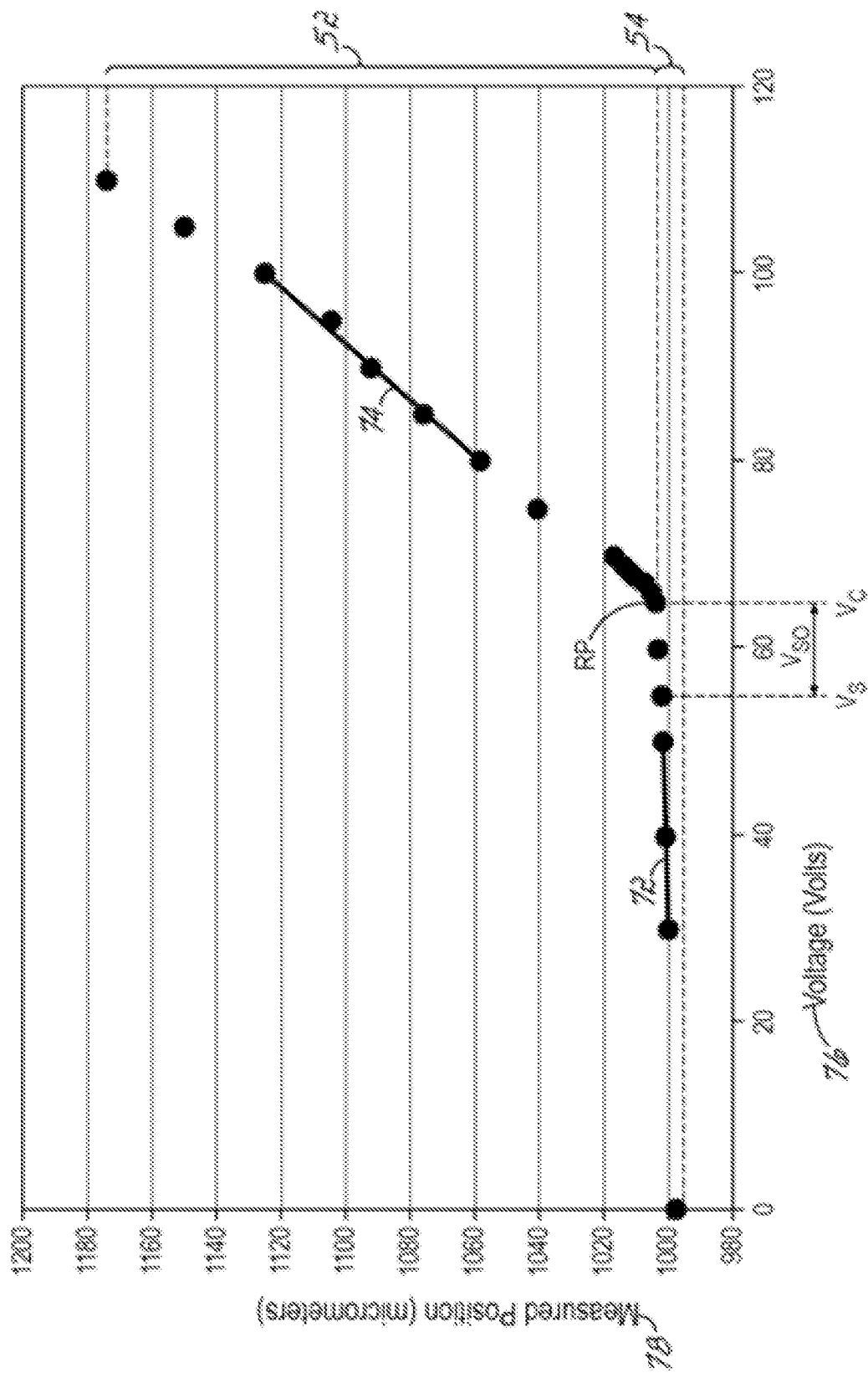
FIG. 5 is a chart of a method of calibrating the jetting profile according to an embodiment of the invention, where an increased measured position indicates the valve closure structure is opening or moving upward.

Illustrative methods of determining the closed voltage (Vc) are now considered. In one illustrative embodiment, when the sensing device 48 indicates one or more consecutive non-changing positions of the valve closure structure 18 (e.g., the drive pin 24 or the poppet 26), the voltage measurement corresponding to the first of these positions is considered the closed voltage (Vc). In another illustrative embodiment, as depicted in FIG. 5 and discussed in greater detail below, the closed voltage (Vc) is determined by ascertaining the intersection of a first trendline 72 with a second trendline 74 in a graph of applied voltage plotted against a corresponding measured position of the valve closure structure 18. Using either illustrative method of determining the closed voltage (Vc), a reference point (RP) may accordingly be determined. The reference point (RP) reflects the closed voltage (Vc) and the position of the valve closure structure 18 (e.g., the poppet 26) corresponding to the closed voltage (Vc). In the illustrative method 400 (FIG. 4) discussed below, the original jetting profile 58 is calibrated to obtain the calibrated jetting profile 60 based at least in part on the closed voltage (Vc) and/or the reference point (RP).

FIG. 4 shows an illustrative method 400 of adjusting or calibrating the original jetting profile 58 of the jetting system 10. At step 402, voltage is applied to the piezoelectric actuator 34 to move the valve closure structure 18 (e.g., the poppet 26) between a non-impact position 52 and an impact position 54. As used herein, the impact position 54 refers to where at least a portion of the valve closure structure 18 is physically impacting the valve seat 22, while the non-impact position 52 refers to where no portion of the valve closure structure 18 is impacting the valve seat 22. It does not matter whether the valve closure structure 18 starts at a non-impact position 52 and moves into an impact position 54, or starts at an impact position 54 and moves into a non-impact position 52. Both arrangements are suitable.

At step 404, the sensing device 48 senses the position of the valve closure structure 18 as the valve closure structure 18 is moved relative to the sensing device 48. At step 406, the control component 14, for example, generates position data 78 (FIG. 5 or 6) and voltage data 76 (FIG. 5 or 6) using signals obtained from the sensing device 48 and based on the known voltage applied to the piezoelectric actuator 34, respectively. Additionally, velocity data (not shown) may be generated as the valve closure structure 18 is moved relative to the sensing device 48, which enables the reference point (RP) and/or closed voltage (Vc) to be established using voltage data 76, position data 78, and velocity data.

At step 408, the reference point (RP) is determined, such as by the control component 14, based on an analysis of the voltage data 76 and the position data 78. The reference point (RP) may be determined using a variety of methods, such as by plotting the voltage data 76 versus the position data 78. The position data 78 includes non-impact and impact position data.

At step 410, the control component 14, for example, determines the closed voltage (Vc) based, at least in part, on the reference point (RP) determined in step 408. For instance, since the reference point (RP) includes both a positional component and a voltage component, the closed voltage (Vc) may be thus ascertained from the voltage component.

At step 411, the sealed voltage (Vs) is determined based, at least in part, on the closed voltage (Vc). For example, the sealed voltage (Vs) may be determined using the closed voltage (Vc) and the sealing offset voltage (Vso) according to the formula Vs=Vc+Vso. It will be appreciated that in some aspects, the sealing offset voltage (Vso) may not be used to effectuate the dispensing operation. In such an aspect, the sealed voltage (Vs) is equal to the closed voltage (Vc) since the sealing offset voltage (Vso) is effectively zero.

At step 412, the sealed voltage (Vc) is used to determine the calibrated jetting profile 60. In particular, the original jetting profile 58 is shifted to the calibrated jetting profile 60 based, at least in part, on the sealed voltage (Vs). For example, the original jetting profile 58 is shifted to the calibrated jetting profile 60 such that the calibrated jetting profile 60 includes a starting voltage 36 and/or ending voltage 68 equal to the sealed voltage (Vs).

FIG. 5 provides an illustrative example of using the intersection of the first trendline 72 and the second trendline 74 to calibrate an original jetting profile 58. It will be noted that the chart shown in FIG. 5 contemplates a dispenser in which application of voltage to the piezoelectric actuator 34 causes the upward movement of the valve closure structure 18 away from the valve seat 22 and the removal or reduction in applied voltage results in the downward movement of the valve closure structure 18 towards the valve seat 22, as is the case with the dispenser 12 shown in FIGS. 1 and 1A. The chart shows the position of the valve closure structure 18 versus the voltage applied to the piezoelectric actuator 34. Unlike FIG. 3, where the sealed voltage (Vs) is the maximum jetting profile voltage, in FIG. 5 the the sealed voltage (Vs) is the minimum jetting profile voltage. Here, the starting voltage 36 is 0 Volts. The valve closure structure 18 is separated from the valve seat 22 at a predetermined position using a voltage relative to the impact voltage. As shown, in the impact position 54, the valve closure structure 18 moves only a few microns in the voltage range from 0 to 60 volts. Sealing takes place in this voltage range, with lower voltages corresponding to higher sealing forces. In non-impact position 52, the valve closure structure 18 moves away from the valve seat 22 as the voltage increases in the 70 to 110 volt range. In the 60 to 70 volt range, there is a transition from sealing to motion. With this arrangement where the sealed voltage (Vs) is the minimum voltage, the closed voltage (Vc) is the voltage where the tip 70 of the valve closure structure 18 last impacts the valve seat 22. The control component 14, for example, generates the first trendline 72, preferably a linear trendline, from a substantially linear portion of the impact position data. The control component 14, for example, also generates a second trendline 74, preferably a linear trendline, from a substantially linear portion of the non-impact position data. Specifically, FIG. 5 has a first linear trendline of y=0.1x+997 microns, and a second linear trendline of y=3.24x+799.4 microns. While trendlines using linear equations are shown and described, the trendlines may alternatively use higher order or piecewise equations.

With continued reference to FIG. 5, the control component 14, for example, determines the intersection of the first trendline 72 with the second trendline 74. This intersection is considered the reference point (RP) having a closed voltage (Vc). The reference point (RP) (and/or the closed voltage (Vc) embodied therein) is used to determine calibrated jetting profile 60. Specifically, the reference point (RP) of FIG. 5 occurs at 1003.3 microns and 62.9 volts. As a result, the original jetting profile 58 is shifted to the calibrated jetting profile 60, such that the calibrated jetting profile 60 includes a maximum voltage (or minimum voltage, depending on the particular dispenser 12 configuration) corresponding to the closed voltage (Vc) plus the sealing offset voltage (Vso) (i.e., the sealed voltage (Vs)). As previously discussed, for the jetting system contemplated with respect to FIG. 5, the sealing offset voltage (Vso) is a negative value, since the sealed voltage (Vs) is less than the closed voltage (Vc).

Figure 6:
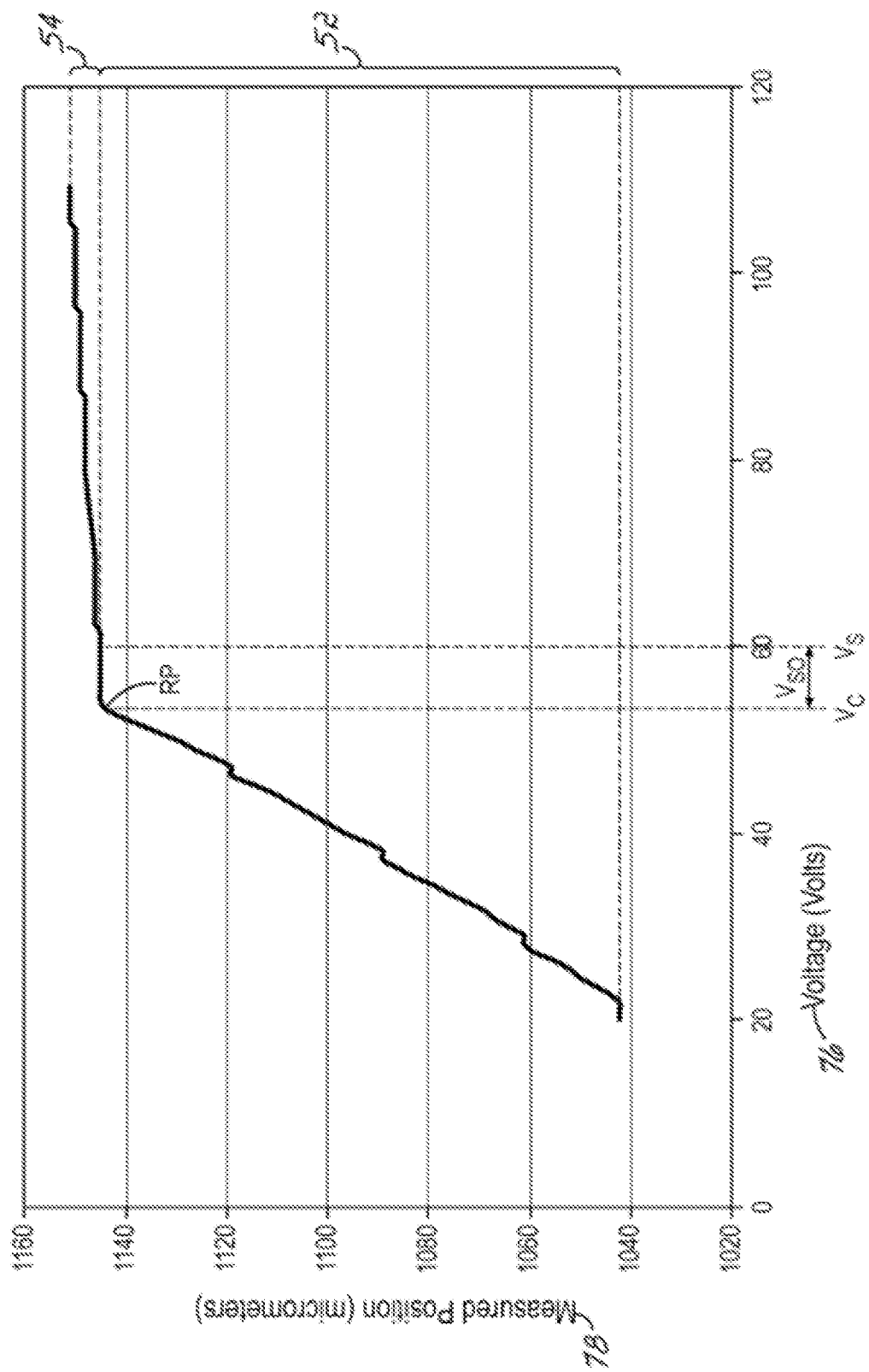
FIG. 6 is a chart of a method of calibrating the jetting profile according to another embodiment of the invention using the jetting system of FIG. 1, where an increased measured position indicates the valve closure structure is closing or moving downward.

FIG. 6 shows another illustrative example of an implementation of at least part of the method 400. Specifically, FIG. 6 shows a chart plotting the measured position of the valve closure structure 18 (i.e., the position data 78) against the voltage applied to the piezoelectric actuator 34 (i.e., the voltage data 76). It will be noted that the chart shown in FIG. 6 contemplates the alternative dispenser 12 configuration described above in which a voltage applied to the piezoelectric actuator 34 (and the consequent expansion thereof) causes the drive pin 24 to move downward and into contact with the poppet 26.

In FIG. 6, the voltage increases from 20 Volts to 110 Volts in 100 incremental steps. This results in each step increasing the voltage by 0.9 Volts (100 steps/(110 Volts-20 Volts)). The tip 70 of the valve closure structure 18 impacts the valve seat 22 at the closed voltage (Vc). Specifically, as the position data 78 is analyzed, one or more consecutive non-changing positions indicate the reference point (RP) (and thus also the closed voltage (Vc)) occurred at the first of these positions. The number of consecutive non-changing positions may be selected by the user using a graphic user interface (GUI). This first position is the reference point (RP) having a closed voltage (Vc) of approx. 55 volts. While four non-changing positions have been found to be appropriate, more or less non-changing positions may be desired. As discussed above, the original jetting profile 58 is then shifted to the calibrated jetting profile 60 based at least in part on the determined closed voltage (Vc).

This method 400 of calibrating a jetting profile provides many benefits. First, this method provides more consistent jetting results across jetting systems 10, and can be widely applied to a variety of jetting systems 10. On a given set of hardware components, the impact position varies up to about 40 micrometers, which corresponds to approximately 20 Volts for the jetting system 10 of FIG. 1. This is especially problematic when attempting to define a jetting profile for multiple jetting systems 10 using a single jetting profile. Instead, this method allows for the peak voltage and the impact voltage to be adjusted for each individual jetting system 10 and for each particular arrangement of hardware components within the jetting system 10. Likewise, by calibrating the individual components together, the tolerance requirements of the components can be lessened, which in turn, reduces the manufacturing costs associated with the hardware components.

This method may reduce the wear and the associated replacement costs on hardware components, such as the valve seat 22, the valve closure structure 18, and the piezoelectric actuation mechanism 16. Further, by using this method periodically as part of a preventative maintenance routine, the method 400 provides more consistent jetting over the life of the jetting system 10, because wear of the hardware components change the relative positioning and closed voltage (Vc). This is important because the distance that the valve closure structure 18 travels from the valve seat 22 during opening, the amount of time the valve closure structure remains separated from the valve seat, and the speed at which the valve closure structure 18 contacts the valve seat 22 on closing strongly influence the volume and consistency of the jetting process. By calibrating the jetting profile relative to the closed voltage (Vc), this improves the consistency of the performance within the life of the jetting system 10. Further, since the valve seat 22 typically wears out more quickly due to the repeated contact with the valve closure structure 18, the valve seat 22 often needs to be replaced before the other components, such as, for example, the piezoelectric actuation mechanism 16 or the valve closure structure 18.

This method 400 allows the original jetting profile 58 to be calibrated to account for specific material properties of the fluid material 38 being dispensed. For example, it is desirable with low-viscosity fluid materials to reduce the impact velocity while increasing the sealing force. This is because the velocity required to sufficiently eject the fluid material 38 from the outlet 40 is reduced. Further, for low viscosity fluid materials, it is desirable to increase the sealing force, to prevent unintended leakage of fluid material 38 through the outlet 40. As used herein, a low-viscosity fluid material generally has a viscosity of less than about 100 centipoise. Conversely, for high-viscosity fluid materials, it is desirable to increase the impact velocity while decreasing the sealing force. As used herein, a high-viscosity fluid material generally has a viscosity of greater than about 1000 centipoise.

Figure 7:
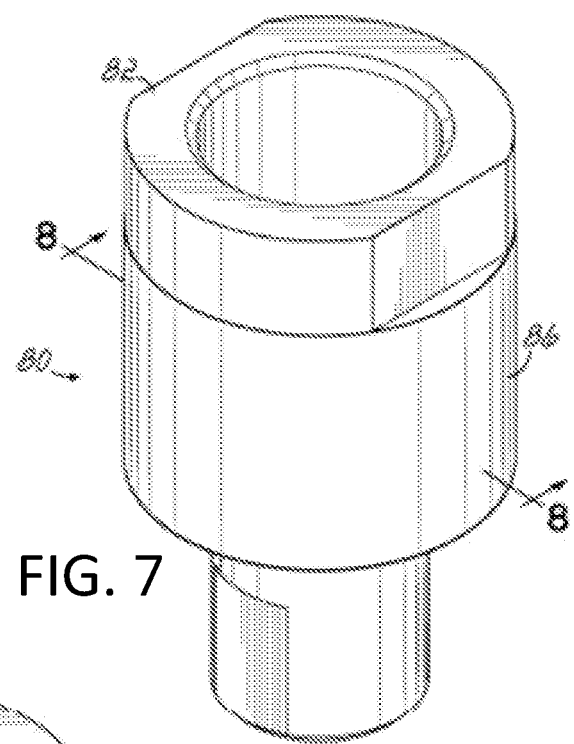
FIG. 7 is a perspective view of a reference cartridge according to an embodiment of the invention.
Figure 8:
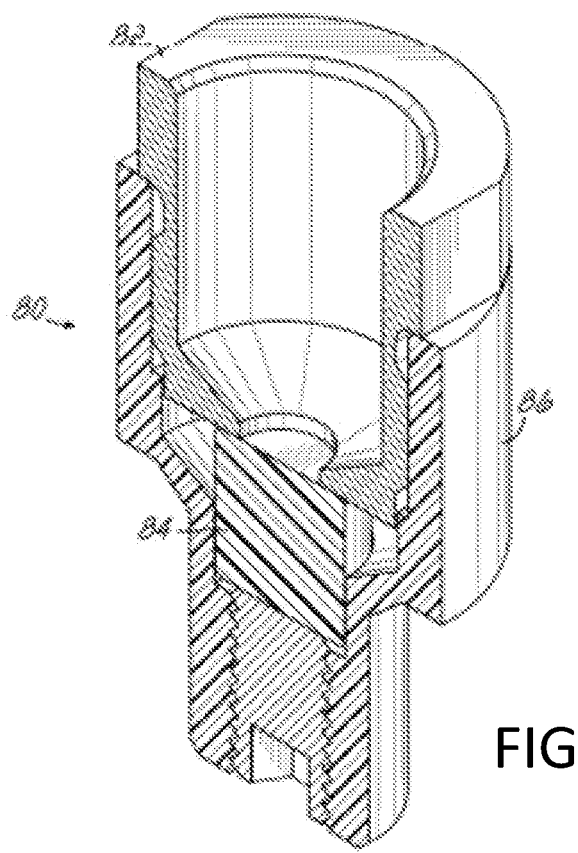
FIG. 8 is a perspective cross sectional view of the reference cartridge of FIG. 7 taken along line 8-8.
Figure 9:
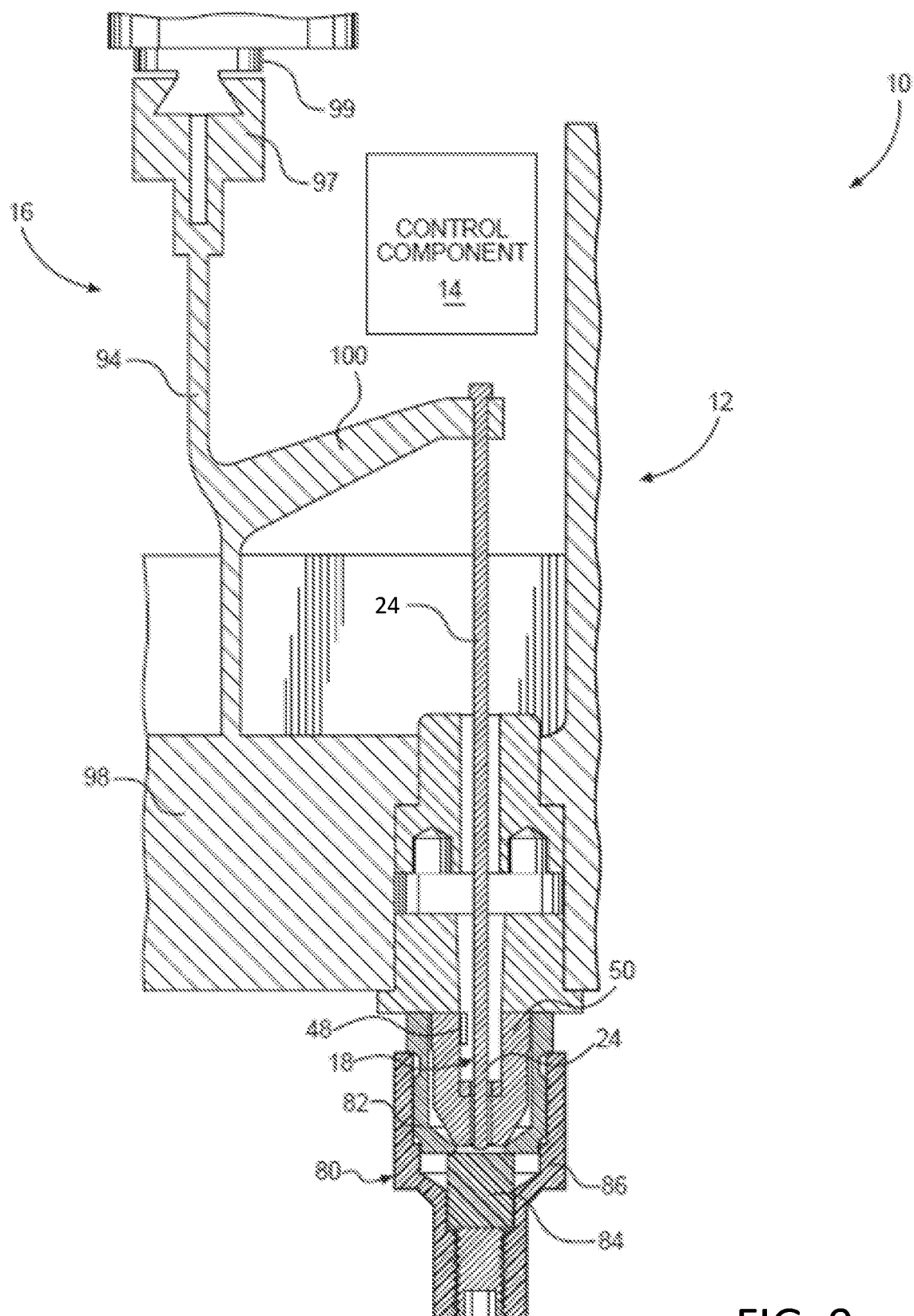
FIG. 9 is a cross sectional view of a jetting system incorporating the reference cartridge of FIGS. 7 and 8 according to an embodiment of the invention.

FIGS. 7-9 show another illustrative embodiment, where the jetting system 10 incorporates a reference cartridge 80. Specifically, FIGS. 7 and 8 show the reference cartridge 80 including a cylinder 82, a mechanical stop 84, and a holder 86. The reference cartridge 80 is preferably positioned at the same location as a brand new fluid cartridge 56. As shown, the mechanical stop 84 is a block of known dimensions that is preferably manufactured with a high degree of precision.

Incorporating the reference cartridge 80 into the jetting system 10 provides a "master calibration" to determine the relative wear between the fluid cartridge 56 and the rest of the jetting dispenser 12. The reference cartridge 80 may also be used to determine the wear of other components of the system 10, such as the valve closure structure 18 and/or the piezoelectric actuation mechanism 16. While FIG. 9 shows the valve closure structure 18 as a drive pin 24, the valve closure structure 18 may include any suitable combination of elements known to one skilled in the art such as, for example, poppets, needles, plungers and/or balls.

Figure 10:
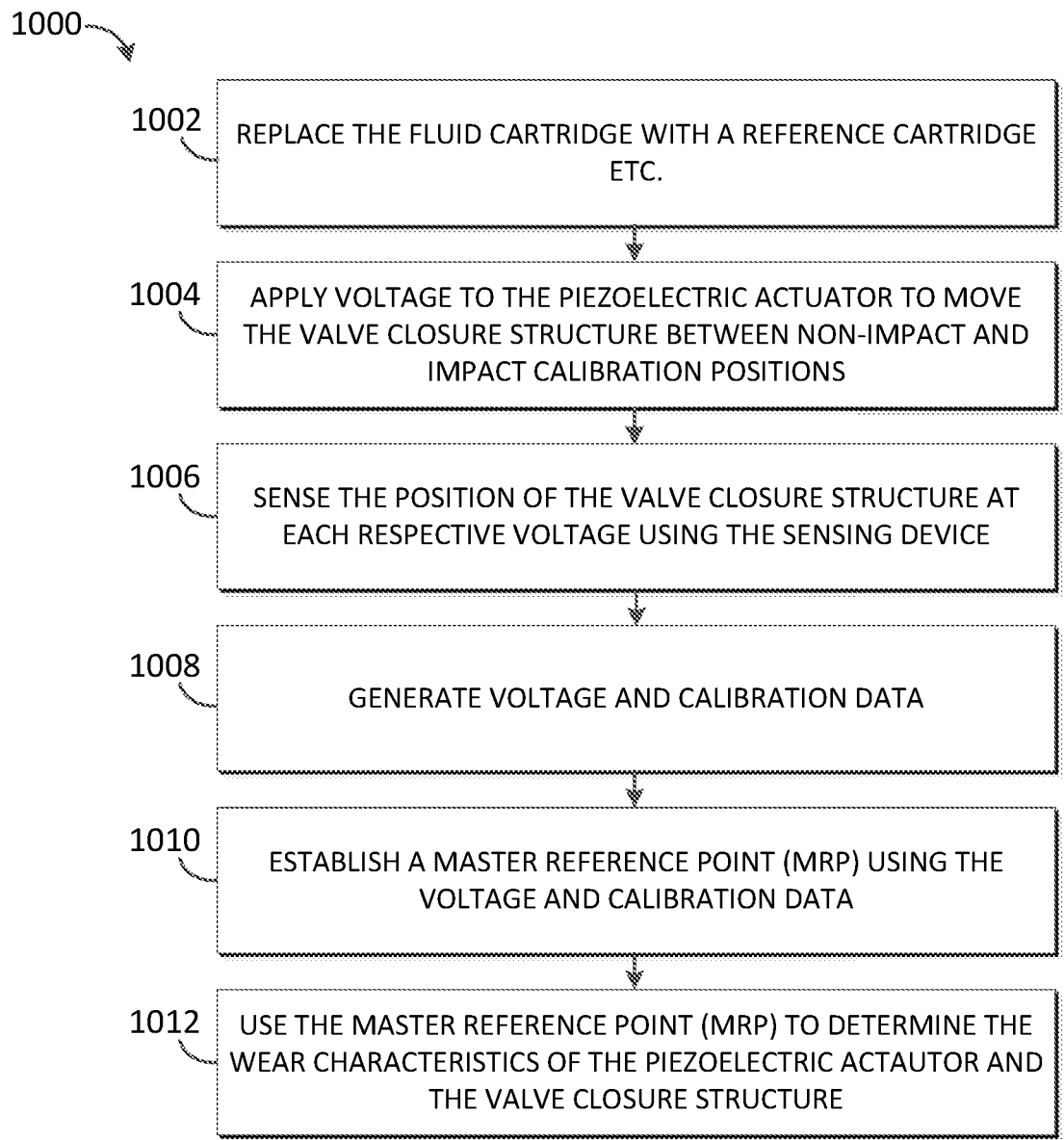
FIG. 10 is a flowchart of a method of calibrating a jetting system using the reference cartridge of FIGS. 7-9 according to an embodiment of the invention.

FIG. 10 shows an illustrative method 1000 for calibrating a jetting system 10 using a reference cartridge 80 having a mechanical stop 84 positioned at a predetermined distance away from the valve closure structure 18 in a non-impact calibration position. At step 1002, the fluid cartridge 56 including a portion of the valve closure structure 18, specifically shown in FIG. 1 as a poppet 26, are removed from the jetting system 10, while the reference cartridge 80 is inserted into the jetting system 10 as shown in FIG. 9. Removing these components and replacing them with the reference cartridge 80 reduces the variability imparting by the fluid cartridge 56 (e.g., the valve seat 22) and allows for a more precise calibration due to fewer components. At step 1004, voltage is applied to the piezoelectric actuator 34 to move the valve closure structure 18 between a non-impact calibration position and an impact calibration position. As used herein, an impact calibration position is where at least a portion of the valve closure structure 18 is impacting the mechanical stop 84, while a non-impact calibration position is where no portion of the valve closure structure 18 is impacting the mechanical stop 84. It does not matter whether the valve closure structure 18 starts at a non-impact calibration position and move into an impact calibration position, or starts at an impact calibration position and moves into a non-impact calibration position. Specifically, FIG. 9 shows the drive pin 24 of the valve closure structure 18 contacting the mechanical stop 84 instead of the poppet 26 of the valve closure structure 18 contacting the valve seat 22 as shown in FIG. 1.

At step 1006, the sensing device 48 senses the position of the valve closure structure 18, either directly or indirectly, while the valve closure structure 18 is actuated by virtue of the applied voltage of step 1004. For example, the sensing device 48 may sense the position of the valve closure structure 18, such as the drive pin 24. At step 1008, voltage calibration data is generated based on the known voltages applied to the piezoelectric actuator 34 in step 1004 and position calibration data is generated based on the sensed positions of the valve closure structure 18. This generation of voltage calibration data and position calibration data may occur simultaneously with or after measuring the movement of the valve closure structure 18.

At step 1010, the control component 14, for example, establishes a master reference point (MRP) using the voltage calibration data and position calibration data. The method for determining the master reference point (MRP) may be performed in an analogous manner as the methods for determining the reference point (RP) discussed above in relation to the method 400. While both seek to determine the closed voltage (Vc), in this illustrative method, the closed voltage (Vc) is determined when at least a portion of the valve closure structure 18 first or last impacts (depending on the arrangement of components) the mechanical stop 84.

At step 1012, the control component 14 uses the master reference point (MRP) to determine one or more wear characteristics of the jetting system 10 by comparing the master reference point with historic data as discussed below. Further, method 1000 may include alerting the user when a wear characteristic of a component is outside of an acceptable tolerance or a component is in need of preventive maintenance. For example, the user may be alerted via the graphic user interface associated with the control component 14. The method may also include tracking the number of cycles the valve closure structure 18 impacts the mechanical stop 84, determining a useful life of the components, and determining preventative maintenance schedules and routines using voltage and position calibration data and the number of cycles.

Using the reference cartridge 80 to calibrate the jetting system 10 aids in determining whether the hardware components are at or near the end of their useable life. This master calibration determines the overall wear in the jetting dispenser 12, but does not determine the relative wear between the piezoelectric actuation mechanism 16 and the valve closure structure 18. However, storing the closed voltage (Vc) associated with the reference cartridge 80 from when the reference cartridge 80 was new, and at various other times, allows for tracking of wear and enhanced preventative maintenance. For example, a master reference point (MRP) may be determined multiple times over a period of time and stored. A contemporary master reference point (MRP) may be presently determined and compared against one or more of the stored master reference points (MRP). If a difference in the contemporary master reference point (MRP) and the one or more stored reference points (MRP) is observed, this may be indicative of wear of one or more components of the dispenser 12.

Further, comparing the closed voltage (Vc) corresponding to the fluid cartridge 56 and/or the replaced components of the valve closure structure 18 to the closed voltage (Vc) corresponding to the reference cartridge 80 tracks the wear of the fluid cartridge 56 and/or the replaced components of the valve closure structure 18, including the wear of the valve seat 22. For example, if the reference cartridge 80 was configured such that the relative positioning of the mechanical stop 84 (with respect to the drive pin 24) matched that of the poppet 26 in a non-worn state, a difference between the closed voltage (Vc) corresponding to the reference cartridge 80 and a previously-recorded closed voltage (Vc) corresponding to the present poppet 26 may reveal wear in the replaced poppet 26 and/or the replaced valve seat 22. Similarly, such a difference may also reveal wear in the piezoelectric actuation mechanism 16 (or component thereof) since, for example, more voltage may now be required to expand the now-worn piezoelectric actuator 34 over the same distance.

In another illustrative embodiment, a method of a user operating a jetting system 10 including a mechanical stop 84 positioned at a predetermined distance away from the valve closure structure 18 in a non-impact calibration position is also disclosed. In this embodiment, the user inputs various parameters into the control component 14 using a graphic user interface (not shown) electronically connected to the control component 14. By way of example and not by limitation, the user enters the fluid type, the jetting frequency, and/or the droplet size. Based at least in part on the parameter(s) provided by the user, the control component 14 then determines a calibrated jetting profile 60 by applying voltage to the piezoelectric actuator 34 of the piezoelectric actuation mechanism 16 to move the valve closure structure 18 between a non-impact calibration position and an impact calibration position. In this embodiment, the impact calibration position occurs where the valve closure structure 18 impacts or leaves contact with the mechanical stop 84, according to the particular configuration of the jetting system 10. The method includes applying the calibration profile to the jetting system 10 using the control component 14. The method includes determining a jetting profile by applying voltage to the piezoelectric actuator 34 to move the valve closure structure 18 between a non-impact calibration position where the valve closure structure 18 is not impacting the valve seat 22 and an impact position 54 where the valve closure structure 18 is impacting the valve seat 22. The method includes applying the calibrated jetting profile 60 to the jetting system 10. A warning on the graphic user interface or an auditory sound may be produced by the control component 14 to warn the user when wear is beyond a recommended level or preventative maintenance is requested.

Figure 11:
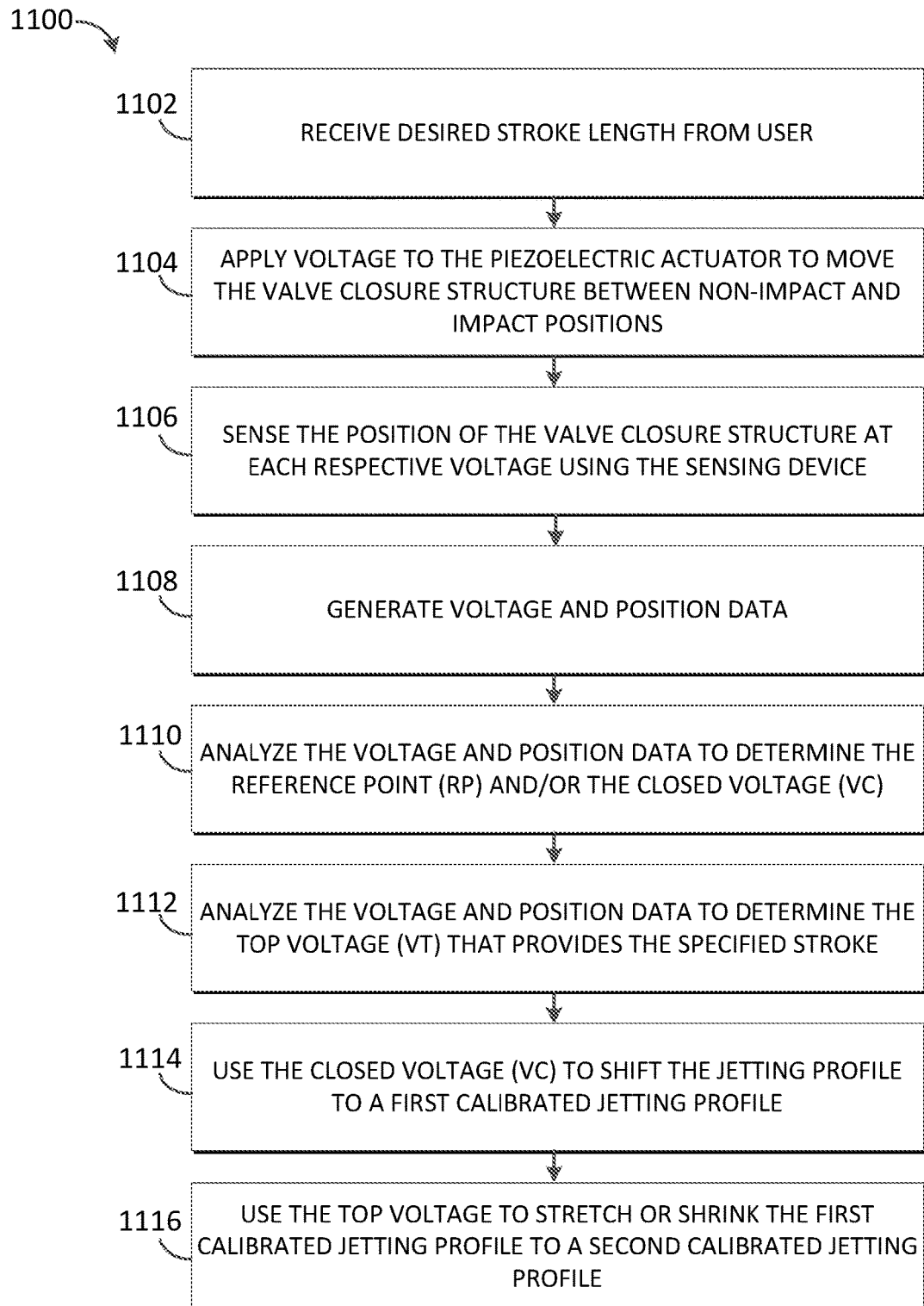
FIG. 11 is a flowchart of a method of calibrating a jetting profile according to an embodiment of the invention.

FIG. 11 depicts an exemplary method 1100 of calibrating the jetting system 10 and/or determining wear of the jetting system 10 using a stroke length of the valve closure structure 18 specified by a user. The method 1100 may be used, for example, to account for variations in the piezoelectric actuation mechanism 16, the valve closure structure 18, and/or other component of the jetting system 10. For instance, due to repeated use or simply slight variations in manufacture, the "gain" of the system may vary. That is, the displacement caused by the piezoelectric actuation mechanism 16 per unit of applied voltage may vary from particular system to system.

At step 1102, a desired stroke length of the valve closure structure 18 is received from a user. The desired stroke length, for example, may specify the desired stroke length of the poppet 26 from its upper-most non-impact position to its impact position with the valve seat 22. In some aspects, the user may further input the sealing offset voltage (Vso) or other parameters relating to the operation of the jetting system 10. Step 1102, as well as the other steps of the method 1100, may be effectuated via the control component 14.

At step 1104, voltage is applied to the piezoelectric actuator 34 to move the valve closure structure 18 (e.g., the poppet 26) between non-impact and impact positions (or vice versa). At step 1106, the position(s) of the valve closure structure 18 are sensed by the sensing device 48 as the valve closure structure 18 is moved between non-impact and impact positions (or vice versa). At step 1108, based on the known voltage applied to the piezoelectric actuator 34 in step 1104 and the sensed position(s) in step 1106, the voltage and position data are generated.

At step 1110, the reference point (RP) is determined based on an analysis of the voltage and position data. The reference point (RP) may be determined in a similar manner as described above with respect to the method 400 shown in FIG. 4 and the illustrative examples of FIGS. 5 and 6. Based on the reference point (RP), the closed voltage (Vc) may additionally be determined. For example, the voltage component of the reference point (RP) may indicate the closed voltage (Vc).

At step 1112, the voltage and position data are analyzed to determine a top voltage (Vt). The top voltage (Vt) is the voltage that, when applied to the piezoelectric actuator 34, provides the desired stroke length received from the user in step 1102. More particularly, the top voltage (Vt) is the voltage that provides the maximum upward travel of the valve closure structure (e.g., the poppet 26) relative to valve seat 22, hence the term "top" voltage. As such, the top voltage (Vt) may be the maximum voltage applied in a jetting profile for a dispenser 12 in which voltage applied to the piezoelectric actuator 34 causes the valve closure structure 18 to move away from the valve seat 22, such as the dispenser 12 depicted in FIGS. 1 and 1A. Conversely, the top voltage (Vt) may be the minimum voltage applied in a jetting profile for a dispenser 12 in which voltage applied to the piezoelectric actuator 34 causes the valve closure structure 18 to move towards the valve seat 22.

At step 1114, the closed voltage (Vc) and/or the reference point (RP) is used to shift the original jetting profile 58 to a first calibrated jetting profile 60a. The determination of the first calibrated jetting profile 60a may be performed in a manner similar to the determination of the calibrated jetting profile 60 described in step 412 of the method 400 and the illustrative examples provided in FIGS. 3, 5 and 6. For example, the first calibrated jetting profile 60a may be determined such that the first calibrated jetting profile 60a has a starting voltage and/or an ending voltage equal to the closed voltage (Vc) or equal to the sealed voltage (Vs) in the event that the sealing offset voltage (Vso) was provided or otherwise accessible.

At step 1116, the top voltage (Vt) is used to determine a second calibrated jetting profile 60b. Specifically, the first calibrated jetting profile 60a is stretched or compacted, relative to the closed voltage (Vc) (or the sealed voltage (Vs), as the case may be), to form the second calibrated jetting profile 60b such that the minimum voltage (in a dispenser 12 where applied voltage causes downward movement of the valve closure structure 18 towards the valve seat 22) or the maximum voltage (in a dispenser 12 where applied voltage causes upward movement of the valve closure structure 18 away from the valve seat 22) of the second calibrated jetting profile 60b equals the top voltage (Vt). It will be noted that step 1114 and step 1116 may be performed in a reverse order than depicted in FIG. 11. For example, the original jetting profile 58 may first be stretched or shrunk based on the top voltage (Vt) and the resulting profile may then be shifted according to the closed voltage (Vc) and/or the sealed voltage (Vs). Similarly, step 1114 and step 1116 may be performed concurrently.

Figure 12:
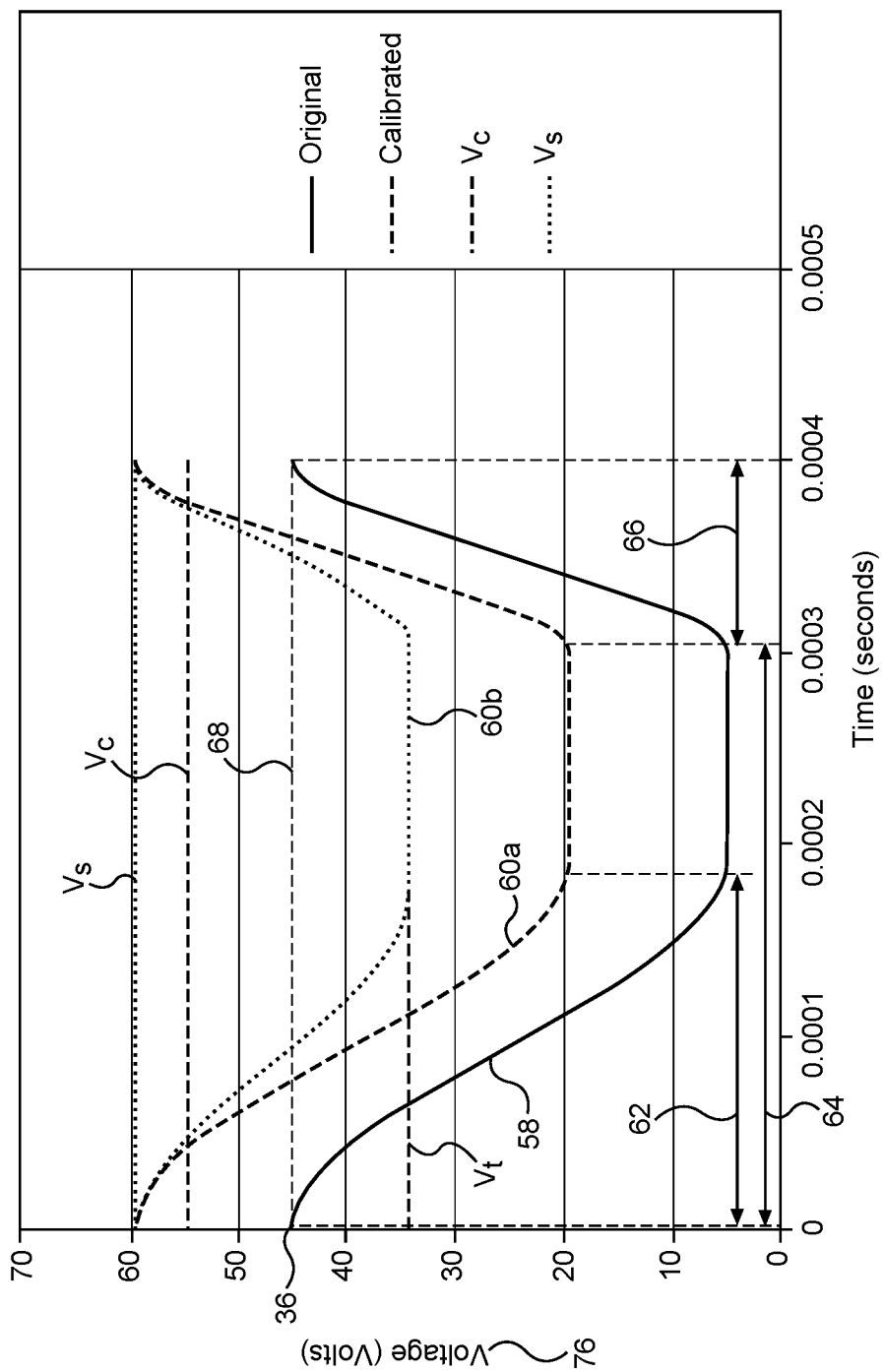
FIG. 12. is a chart depicting jetting profiles according to an embodiment of the invention.
Figure 13:
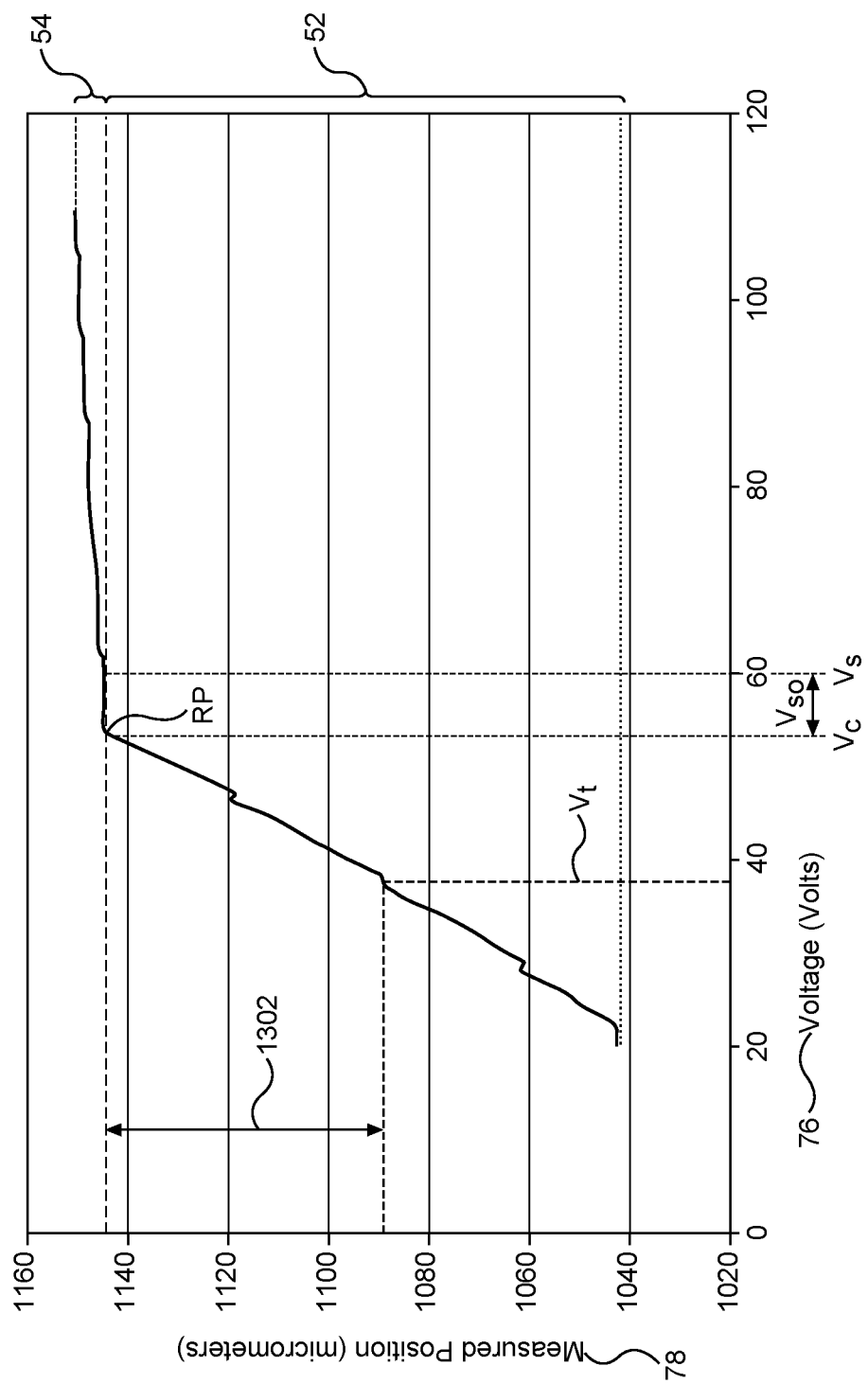
FIG. 13 is a chart of a method of calibrating the jetting profile according to another embodiment of the invention using the jetting system of FIG. 1, where an increased measured position indicates the valve closure structure is closing or moving downward.

With reference to FIGS. 12 and 13, an illustrative example of the method 1100 will now be provided. FIG. 12 is similar in many respects to FIG. 3 and depicts the original jetting profile 58, as well as the first calibrated jetting profile 60a and the second calibrated jetting profile 60b. FIG. 13 is similar in many respects to FIG. 6 and includes a chart of measured position data 78 plotted against voltage data 76. The chart of FIG. 13 includes data during the non-impact position 52 (i.e., the valve closure structure 18 is moving towards the valve seat 22) and during the impact position 54. The gradient of the charted line during the non-impact position may be considered the displacement versus voltage "gain" of this particular dispenser 12.

Initially, a user provides an input, such as via the control component 14, of 50 micrometers for the desired stroke length 1302 of the valve closure structure 18, as well as a sealed voltage offset (Vso) of approx. 5 volts. Voltage is applied to the piezoelectric actuator 34, the position(s) of the valve closure structure 18 is sensed by the sensing device 48, and the position data 78 and voltage data 76 are generated accordingly. Using methodologies described above in greater detail, the voltage data 76 and position data 78 are analyzed to determine the reference point (RP) shown in FIG. 13, here corresponding to approx. 55 volts and a displacement of approx. 1145 micrometers.

Based on the closed voltage (Vc) (55 volts) of the reference point (RP), the first calibrated jetting profile 60a is determined. The first calibrated jetting profile 60a is determined by shifting the original jetting profile 58 such that the maximum voltage of the first calibrated jetting profile 60a equals the sealed voltage (Vs), which is the closed voltage (Vc) plus the sealing offset voltage (Vso). In the present example, the maximum voltage of the first calibrated jetting profile 60a is 60 volts (55 volts+5 volts).

The second calibrated jetting profile 60b is determined based at least in part on the top voltage (Vt). In particular, the second calibrated jetting profile 60b is determined by stretching or compacting the first calibrated jetting profile 60a so that the minimum voltage of the second calibrated jetting profile 60b equals the top voltage (Vt). The top voltage (Vt) may be determined by an analysis of the charted data in FIG. 13. For example, with the reference point (RP) already determined, the desired stroke length 1302 (i.e., the change in position of the valve closure structure 18) may be subtracted from the position of the reference point (RP). Here, this would result in a position of 1095 micrometers (1145 μm−50 μm=1095 μm). The position of 1095 micrometers may be cross-referenced in the data line in the chart to determine that the position of 1095 micrometers corresponds to the top voltage (Vt) of approx. 37 volts.

As another technique for determining the top voltage (Vt), FIG. 13's charted data during the non-impact position 52 may be extrapolated to a trend line. The trend line may be expressed in the form of a y=mx+c equation, wherein y equals the measured position, x equals the voltage, m equals the gradient of the line, and c equals some constant. The top voltage (Vt) may be determined by setting y in the aforementioned equation to 1095 micrometers (i.e, the difference between the position of the reference point (RP) and the specified desired stroke length 1302), and solving for x, which will yield the top voltage (Vt). It will be appreciated that these and other techniques for determining the top voltage (Vt) may be implemented via software, which may be executed by the control component 14.

With the top voltage (Vt) determined to be 37 volts, the first calibrated jetting profile 60*a* may be compacted into the second calibrated jetting profile 60*b* such that the minimum voltage of the second calibrated jetting profile 60*b* is equal to 37 volts, as can be seen in FIG. 12.

Figure 14:
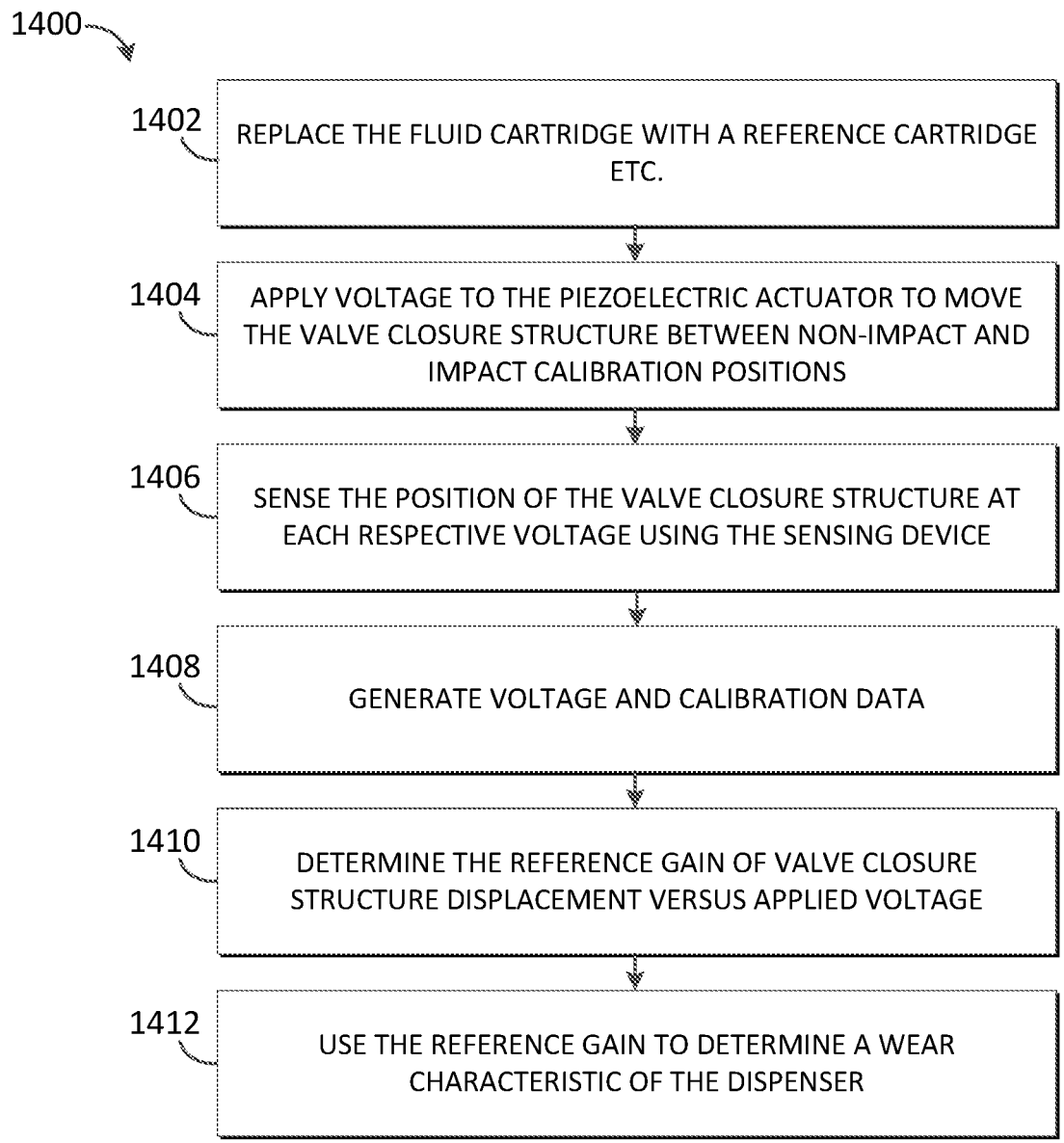
FIG. 14 is a flowchart of a method of calibrating a jetting system using the reference cartridge of FIGS. 7-9 according to an embodiment of the invention.

FIG. 14 depicts an illustrative method 1400 of calibrating a jetting system 10 and/or determining a wear characteristic (including electrical degradation) of the jetting system 10 using a reference cartridge 80 having a mechanical stop 84 positioned at a predetermined distance away from the valve closure structure 18 in a non-impact calibration position, as shown in FIGS. 7-9.

At step 1402, the fluid cartridge 56 is removed from the jetting system 10 and replaced with the reference cartridge 80. At step 1404, voltage is applied to the piezoelectric actuator 34 to move the valve closure structure 18 between a non-impact calibration position and an impact calibration position. As used herein, an impact calibration position is where at least a portion of the valve closure structure 18 is impacting the mechanical stop 84, while a non-impact calibration position is where no portion of the valve closure structure 18 is impacting the mechanical stop 84. For example, the drive pin 24 may contact the mechanical stop 84 in the impact position instead of the poppet 26 contacting the valve seat 22 in the configuration shown in FIG. 1.

At step 1406, the sensing device 48 senses the position of the valve closure structure 18, either directly or indirectly, while the valve closure structure 18 is actuated by virtue of the applied voltage of step 1404. At step 1408, voltage calibration data is generated based on the known voltages applied to the piezoelectric actuator 34 in step 1404 and position calibration data is generated based on the sensed positions of the valve closure structure 18. This generation of voltage calibration data and position calibration data may occur simultaneously with or after measuring the movement of the valve closure structure 18.

At step 1410, a reference "gain" is determined, wherein the reference gain reflects the ratio of the displacement of the valve closure structure 18 to the voltage applied to the piezoelectric actuator 34. For example, since calibration position and voltage data may be plotted against one another in the same manner as the position data 78 and the voltage data 76 shown in FIG. 6 or 13, the data line in such a chart corresponding to the non-impact calibration position may be analyzed to determine a trendline. The gradient of the trendline may accordingly represent the reference gain. The reference gain may be stored for later use, such as in a comparison of a current reference gain with one or more stored reference gains.

At step 1412, the reference gain is used to determine a wear characteristic (including electrical degradation) of the dispenser 12 or component thereof, including the valve seat 22, the valve closure structure 18, or the piezoelectric actuation mechanism 16. For example, the reference gain may be compared against a pre-determined range of gains reflecting "normal" gains. If the reference gain is outside of the pre-determined range of gains, this may indicate that the dispenser 12 or component thereof has suffered detrimental wear and may require maintenance or replacement. As another example, the current reference gain may be compared against a past reference gain for the same dispenser 12. If the difference between the current reference gain and the past reference gain is greater than a pre-determined threshold, this may also be indicative of wear. Upon a determination of the wear characteristic, the user may be notified, such as via a graphic user interface associated with the control component 14 or an auditory signal.

As referred to herein, that control component 14 may be any type of processing (or computing) device having one or more processors. For example, the control component 14 can be an individual processor, workstation, mobile device, computer, cluster of computers, set-top box, game console or other device having at least one processor. In an embodiment, more than one control component 14 may be implemented on the same processing device. Such a processing device may include software, firmware, hardware, or a combination thereof. Software may include one or more applications and an operating system. Hardware can include, but may not be limited to, a processor, memory, and/or graphical user display. The control component 14 may be disposed as part of the dispenser 12 and/or as a separate component from the dispenser 12.

While the present invention has been illustrated by the description of specific embodiments thereof, and while the embodiments have been described in considerable detail, it is not intended to restrict or in any way limit the scope of the appended claims to such detail. The various features discussed herein may be used alone or in any combination. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope or spirit of the general inventive concept.

What is claimed is:

1. A method of calibrating the jetting profile of a jetted fluid material for a jetting system, the jetting system including a jetting dispenser and a control component operatively coupled to the jetting dispenser, the jetting dispenser including a valve seat, a valve closure structure, and a piezoelectric actuation mechanism having a piezoelectric actuator, the method comprising:

applying voltage to the piezoelectric actuator to move the valve closure structure between a non-impact position where the valve closure structure is not impacting the valve seat and an impact position where at least a portion of the valve closure structure is impacting the valve seat;

generating voltage data as the valve closure structure is moved;

sensing the position of the valve closure structure as the valve closure structure is moved using a sensing device;

generating position data as the valve closure structure is moved;

establishing a reference point using the voltage and position data; and using the reference point to adjust the voltage applied to the piezoelectric actuator.

2. The method of claim 1, further comprising:

generating velocity data as the valve closure structure is moved; and establishing a reference point using the voltage, position, and velocity data.

3. The method of claim 2, wherein using the reference point further comprises:
using the reference point to decrease an impact velocity and increase a sealing force for low-viscosity fluid materials.

4. The method of claim 2, wherein using the reference point further comprises:
using the reference point to increase an impact velocity and decrease a sealing force for high-viscosity fluid materials.

5. The method of claim 1, wherein using the reference point further comprises:
using the reference point to determine the wear characteristics of at least one of: the piezoelectric actuation mechanism, the valve closure structure, and valve seat.

6. The method of claim 1, wherein the sensing device further comprises a linear encoder.

7. The method of claim 1, wherein sensing the position of the valve closure structure further comprises:
sensing the position of the valve closure structure using a sensing device directly attached to the valve closure structure.

8. The method of claim 1, wherein establishing a reference point using the voltage and position data further comprises plotting the voltage and position data.

9. The method of claim 1, wherein the position data further includes non-impact and impact position data, and wherein establishing the reference point further comprise:
generating a first trendline from at least a portion of the non-impact position data;
generating a second trendline from at least a portion of the impact position data; and
determining the intersection of the first and second trendlines to establish the reference point.

10. The method of claim 9, wherein generating a first and second trendlines and determining the intersection further comprise:
generating a first linear trendline from a linear portion of the non-impact position data;
generating a second linear trendline from a linear portion of the impact position data; and
determining the intersection of the first and second linear trendlines to establish the reference point.

11. A method of calibrating the jetting profile of a jetted fluid material for a jetting system, the jetting system including a jetting dispenser and a control component operatively coupled to the jetting dispenser, the jetting dispenser including a piezoelectric actuation mechanism having a piezoelectric actuator, a valve closure structure, and a mechanical stop positioned at a predetermined distance away from the valve closure structure in a non-impact calibration position, the method comprising:
applying voltage to the piezoelectric actuator to move the valve closure structure between the non-impact calibration position where the valve closure structure is not impacting the mechanical stop and an impact calibration position where at least a portion of the valve closure structure is impacting the mechanical stop;
generating voltage calibration data as the valve closure structure is moved;
sensing the position of the valve closure structure as the valve closure structure is moved using a sensing device;
generating position calibration data as the valve closure structure is moved;
establishing a master reference point using the voltage and position calibration data; and
using the master reference point to determine wear of at least one of: the piezoelectric actuation mechanism and the valve closure structure.

12. The method of claim 11, wherein using the master reference point further comprises:
storing the master reference point over a period of time;
comparing the stored master reference point to a current master reference point; and
using the comparison to determine the wear or predict preventative maintenance of at least one of: the piezoelectric actuation mechanism and the valve closure structure.

13. The method of claim 11, wherein using the master reference point further comprises:
storing the position and voltage calibration data over a period of time;
comparing the stored position and voltage calibration data to current position and voltage calibration data; and
using the comparison to determine the wear or predict preventative maintenance of at least one of: the piezoelectric actuation mechanism and the valve closure structure.

14. The method of claim 11, wherein the piezoelectric actuation mechanism further comprises:
a piezoelectric stack comprising a plurality of piezoelectric elements; and
an amplifier positioned between the piezoelectric stack and the valve closure structure.

15. The method of claim 14, further comprising:
alerting the user when the wear of at least one of: the piezoelectric actuation mechanism and the valve closure structure is outside of an acceptable tolerance.

16. The method of claim 14, further comprising:
tracking a number of cycles the valve closure structure impacts the valve seat; and
determining a useful life of at least one of: the piezoelectric actuation mechanism, the valve closure structure, and the valve seat using the voltage and position calibration data and the number of cycles.

17. The method of claim 16, further comprising:
alerting the user of the useful life of at least one of: the piezoelectric actuation mechanism, the valve closure structure, and the valve seat.

18. The method of claim 14, further comprising:
tracking a number of cycles the valve closure structure impacts the valve seat;
determining the need for preventative maintenance to at least one of: the piezoelectric actuation mechanism, the valve closure structure, and the valve seat using the voltage and position calibration data and the number of cycles.

19. The method of claim 18, further comprising:
alerting the user of a need for preventative maintenance to at least one of: the piezoelectric actuation mechanism, the valve closure structure, and the valve seat.

20. A method of calibrating the jetting profile of a jetted fluid material for a jetting system, the jetting system including a jetting dispenser and a control component operatively coupled to the jetting dispenser, the jetting dispenser including a valve seat, a valve closure structure, a piezoelectric actuation mechanism having a piezoelectric actuator, and a mechanical stop positioned at a predetermined distance away from the valve closure structure in a non-impact calibration position, the method comprising:
applying voltage to the piezoelectric actuator to move the valve closure structure between a non-impact position where the valve closure structure is not impacting the valve seat and an impact position where at least a portion of the valve closure structure is impacting the valve seat;

generating voltage data as the valve closure structure is moved;

sensing the position of the valve closure structure as the valve closure structure is moved using a sensing device;

generating position data as the valve closure structure is moved;

establishing a reference point using the voltage and position data;

applying voltage to the piezoelectric actuator to move the valve closure structure between the non-impact calibration position where the valve closure structure is not impacting the mechanical stop and an impact calibration position where at least a portion of the valve closure structure is impacting the mechanical stop;

generating voltage calibration data as the valve closure structure is moved;

sensing the position of the valve closure structure as the valve closure structure is moved using the sensing device;

generating position calibration data as the valve closure structure is moved;

establishing a master reference point using the voltage calibration data and the position calibration data; and comparing the reference point to the master reference point to determine wear of the valve seat.

21. A method of operating a jetting system by a user, the jetting system including a jetting dispenser and a control component operatively coupled to the jetting dispenser, the jetting dispenser including a piezoelectric actuation mechanism having a piezoelectric actuator, a valve seat, a valve closure structure, and a mechanical stop positioned at a predetermined distance away from the valve closure structure in a non-impact calibration position, the method comprising:

receiving input of an operational parameter from a user via the control component, the operational parameter indicative of at least one of: a fluid type, a jetting frequency, and a droplet size;

based at least in part on the operational parameter, determining a master calibration profile by applying voltage to the piezoelectric actuator to move the valve closure structure between the non-impact calibration position where the valve closure structure is not impacting the mechanical stop and an impact calibration position where at least a portion of the valve closure structure is impacting the mechanical stop;

applying the master calibration profile to the jetting system using the control component;

determining a calibrated jetting profile by applying voltage to the piezoelectric actuator to move the valve closure structure between a non-impact calibration position where the valve closure structure is not impacting the valve seat and an impact calibration position where at least a portion of the valve closure structure is impacting the valve seat; and applying the calibrated jetting profile to the jetting system.

22. A method of doing maintenance in a jetting system that includes a jetting dispenser and a control component operatively coupled to the jetting dispenser, the jetting dispenser including a valve closure structure, a valve seat, and a piezoelectric actuation mechanism having a piezoelectric actuator, the method comprising:

applying voltage to the piezoelectric actuator to move the valve closure structure between a first position and a second position;

generating voltage data as the valve closure structure is moved;

sensing the position of the valve closure structure as the valve closure structure is moved using a sensing device;

generating position data as the valve closure structure is moved; and using the voltage data and the position data for preventative maintenance of one or more components of the jetting system.

23. The method of claim 22, wherein the one or more components is at least one of: the piezoelectric actuation mechanism, the piezoelectric actuator, the valve seat, and the valve closure structure.

24. The method of claim 22, further comprising:

using the voltage data and the position data to generate an alert indicative of a need for the preventative maintenance.

25. The method of claim 22, wherein using the voltage data and the position data further comprises:

using the voltage data and the position data to determine a wear characteristic of the one or more components.

26. The method of claim 25, further comprising:

generating an alert indicative of the wear characteristic.

27. A method of calibrating the jetting profile of a jetting fluid material for a jetting system, the jetting system including a jetting dispenser and a control component operatively coupled to the jetting dispenser, the jetting dispenser including a valve seat, a valve closure structure, and a piezoelectric actuation mechanism having a piezoelectric actuator, the method comprising:

receiving input from a user of a desired stroke length of the valve closure structure;

applying voltage to the piezoelectric actuator to move the valve closure structure between a non-impact position where the valve closure structure is not impacting the valve seat and an impact position where at least a portion of the valve closure structure is impacting the valve seat;

generating voltage data as the valve closure structure is moved;

sensing the position of the valve closure structure as the valve closure structure is moved using a sensing device;

generating position data as the valve closure structure is moved;

based, at least in part, on the voltage data and the position data, determine a reference point;

based, at least in part, on the voltage data and the position data, determining a top voltage corresponding to the position of the valve closure structure resulting in the desired stroke length of the valve closure structure; and using the reference point and the top voltage to adjust a voltage applied to the piezoelectric actuator.

28. The method of claim 27, wherein using the reference point and the top voltage to adjust the voltage applied to the piezoelectric actuator further comprises:

adjusting the voltage, corresponding to a position of the valve closure structure in contact with the valve seat, to a voltage embodied by the reference point; and adjusting the voltage, corresponding to a positon of the valve closure structure at a maximum distance from the valve seat, to the top voltage.

29. The method of claim 27, wherein the position data further includes non-impact and impact position data, and wherein determining the reference point further comprises:
  generating a first trendline from at least a portion of the non-impact position data;
  generating a second trendline from at least a portion of the impact position data; and
  determining the intersection of the first and second trendlines to determine the reference point.

30. The method of claim 29, wherein determining the top voltage further comprises:
  determining a position of the valve closure structure by determining a difference between the position embodied in the reference point and the desired stroke length of the valve closure structure; and
  determine the top voltage using the position of the valve structure and the first trendline.

31. A method of calibrating the jetting profile of a jetted fluid material for a jetting system, the jetting system including a jetting dispenser and a control component operatively coupled to the jetting dispenser, the jetting dispenser including a piezoelectric actuation mechanism having a piezoelectric actuator, a valve closure structure, and a mechanical stop positioned at a predetermined distance away from the valve closure structure in a non-impact calibration position, the method comprising:
  applying voltage to the piezoelectric actuator to move the valve closure structure between the non-impact calibration position where the valve closure structure is not impacting the mechanical stop and an impact calibration position where at least a portion of the valve closure structure is impacting the mechanical stop;
  generating voltage calibration data as the valve closure structure is moved;
  sensing the position of the valve closure structure as the valve closure structure is moved using a sensing device;
  generating position calibration data as the valve closure structure is moved;
  based, at least in part, on the voltage calibration data and the position calibration data, determining a reference gain indicative of a ratio of the displacement of the valve close structure to the voltage applied to the piezoelectric actuator; and
  based, at least in part, on the reference gain, determining a wear characteristic of at least one of: the piezoelectric actuation mechanism and the valve closure structure.

32. The method of claim 31, wherein determining a wear characteristic further comprises:
  storing the reference gain over a period of time;
  comparing the stored reference gain to a current reference gain; and
  using the comparison to determine the wear or predict preventative maintenance of at least one of: the piezoelectric actuation mechanism and the valve closure structure.

33. The method of claim 31, wherein determining a wear characteristic further comprises:
  comparing the reference gain to a pre-determined ranges of gains; and
  using the comparison to determine the wear or predict preventative maintenance of at least one of: the piezoelectric actuation mechanism and the valve closure structure.

* * * * *